(12) United States Patent
Song et al.

(10) Patent No.: US 12,075,622 B2
(45) Date of Patent: Aug. 27, 2024

(54) INTEGRATED CIRCUIT DEVICES AND ELECTRONIC SYSTEMS INCLUDING THE SAME

(71) Applicant: Samsung Electronics Co., Ltd., Suwon-si (KR)

(72) Inventors: Hyeonjoo Song, Hwaseong-si (KR); Haemin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 432 days.

(21) Appl. No.: 17/465,928

(22) Filed: Sep. 3, 2021

(65) Prior Publication Data

US 2022/0093639 A1 Mar. 24, 2022

(30) Foreign Application Priority Data

Sep. 24, 2020 (KR) ........................ 10-2020-0124070

(51) Int. Cl.
*H10B 43/27* (2023.01)
*H01L 23/48* (2006.01)
(Continued)

(52) U.S. Cl.
CPC ........... *H10B 43/27* (2023.02); *H01L 23/481* (2013.01); *H10B 41/10* (2023.02); *H10B 41/27* (2023.02);
(Continued)

(58) Field of Classification Search
CPC ........ H10B 41/10; H10B 41/27; H10B 41/35; H10B 41/40; H10B 41/50; H10B 43/10; H10B 43/27; H10B 43/35; H10B 43/40; H10B 43/50; H01L 23/528; H01L 23/5283; H01L 23/5329; H01L 23/481; H01L 29/04; H01L 29/16; H01L 29/4234; H01L 29/42352; H01L 29/511; H01L 29/518; H01L 29/66825; H01L 29/66833; H01L 29/7883; H01L 29/788; H01L 29/792;
(Continued)

(56) References Cited

U.S. PATENT DOCUMENTS 8,741,761 B2 6/2014 Lee et al.
9,230,987 B2 1/2016 Pachamuthu et al.
(Continued)

FOREIGN PATENT DOCUMENTS

CN 110800108 A 2/2020
CN 110808249 A 2/2020
(Continued)

*Primary Examiner* — Natalia A Gondarenko
(74) *Attorney, Agent, or Firm* — Myers Bigel, P.A.

(57) ABSTRACT

Integrated circuit devices may include: a gate stack extending on a substrate in a first direction that may be parallel to a main surface of the substrate, the gate stack including a plurality of gate electrodes overlapping each other in a vertical direction that may be perpendicular to the main surface of the substrate; a channel structure extending through the gate stack and extending in the vertical direction; a word line cut opening extending through the gate stack in the vertical direction and extending in the first direction; and an upper support layer on the gate stack and including a hole overlapping the word line cut opening in the vertical direction. An upper surface of the channel structure is in contact with a lower surface of the upper support layer.

20 Claims, 22 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC .............. *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ............ H01L 29/7926; H01L 29/1033; H01L 21/76877; H01L 21/31055; H01L 21/31116; H01L 21/31138; H01L 21/28282; H01L 21/67069; H01L 21/822; H01L 21/76283; H01L 21/764; H01L 21/8221; H01L 27/0688; H01L 27/2481; H01L 27/1052; H01L 27/11551; H01L 27/11578; H01L 27/11582; H01L 27/11556; H01L 27/11524; H01L 27/11565; H01L 27/11568; H01L 27/11519; H01L 27/1157; H01L 27/115; H01L 27/11597; G11C 16/0408

USPC .................................. 257/329, 314, 318, 506
See application file for complete search history.

(56) References Cited

U.S. PATENT DOCUMENTS

| 9,236,395 | B1 | 1/2016 | Sasaki |
| 9,728,551 | B1 | 8/2017 | Lu et al. |
| 10,559,592 | B1 | 2/2020 | Liu et al. |
| 10,593,694 | B2 | 3/2020 | Tsuda et al. |
| 2011/0065270 | A1* | 3/2011 | Shim .................... H10B 43/27 257/E21.613 |
| 2016/0190155 | A1* | 6/2016 | Lee ........................ H10B 43/35 438/667 |
| 2018/0122819 | A1* | 5/2018 | Shim ..................... H10B 43/50 |
| 2018/0210830 | A1* | 7/2018 | Malladi .................. H01L 25/18 |
| 2019/0067182 | A1* | 2/2019 | Lee ........................ H01L 23/528 |
| 2019/0378856 | A1 | 12/2019 | Park et al. |

FOREIGN PATENT DOCUMENTS

| CN | 110808250 A | 2/2020 |
| CN | 110808253 A | 2/2020 |

* cited by examiner

_US 12,075,622 B2_

INTEGRATED CIRCUIT DEVICES AND ELECTRONIC SYSTEMS INCLUDING THE SAME

CROSS-REFERENCE TO RELATED APPLICATION

This application is based on and claims priority under 35 U.S.C. § 119 to Korean Patent Application No. 10-2020-0124070, filed on Sep. 24, 2020 in the Korean Intellectual Property Office, the disclosure of which is incorporated by reference herein in its entirety.

BACKGROUND

The inventive concept relates to an integrated circuit device and an electronic system including the integrated circuit device, and more particularly, to an integrated circuit device including a non-volatile vertical memory device and an electronic system including the non-volatile vertical memory device.

It may be beneficial to increase the degree of integration of integrated circuit devices for performance and manufacturing cost. Because the degree of integration of a two-dimensional memory device depends on an area occupied by a unit memory cell, it may be influenced by the level of fine pattern formation technology. However, expensive equipment may be used to form a fine pattern, and the areas of chip dies may be limited, and thus an increase of the degree of integration of two-dimensional memory devices may be limited.

SUMMARY

Some embodiments of the inventive concept provide integrated circuit devices having excellent electrical characteristics. The integrated circuit devices may be manufactured by methods in which an insulating sacrificial layer may be first formed in a channel hole instead of a conductive material layer in a vertical memory device, and then a word line cut may be etched, thereby reducing or possibly suppressing the occurrence of defects due to tilting of plasma ions during the etching process. Some embodiments of the inventive concept also provide electronic systems including the integrated circuit devices.

Objectives/advantages of the inventive concept may not be limited to the aforesaid, and other objectives/advantages not described herein will be clearly understood by those of ordinary skill in the art from descriptions below.

According to some embodiments of the inventive concept, integrated circuit devices may include a substrate (e.g., a semiconductor substrate), a first gate stack extending on the upper base layer in a first direction and a second direction, which may be parallel to a main surface (e.g., a lower surface) of the semiconductor substrate and may cross each other, the first gate stack including a plurality of first gate electrodes and a plurality of first insulating layers alternately stacked in a third direction that may be perpendicular to the main surface, a second gate stack extending on the first gate stack in the first direction and the second direction, the second gate stack including a plurality of second gate electrodes and a plurality of second insulating layers alternately stacked in the third direction, a first channel hole extending through the first gate stack and extending in the third direction, a second channel hole extending through the second gate stack in the third direction and extending to be arranged on the first channel hole, a channel structure in (e.g., filling) the first channel hole and the second channel hole, a word line cut opening that may extend through the first and second gate stacks in the third direction and may extend in the first direction, an upper support layer on the second gate stack and including a plurality of hole portions, each of which overlaps the word line cut opening in the third direction and includes a portion that is in the second gate stack, and an insulating structure in (e.g., filling) the word line cut opening and the plurality of hole portions, wherein an upper surface (e.g., an uppermost surface) of the channel structure is in contact with a lower surface (e.g., a lowermost surface) of the upper support layer, and a level of the uppermost surface of the channel structure is higher than a level of a lower surface or a lower end (e.g., a lowermost surfaces or a lowermost end) of each of the plurality of hole portions.

According to some embodiments of the inventive concept integrated circuit devices may include a gate stack extending on a substrate (e.g., a semiconductor substrate) in a first direction parallel to a main surface (e.g., a lower surface) of the semiconductor substrate, the gate stack including a plurality of gate electrodes overlapping each other in a vertical direction that may be perpendicular to the main surface, a channel structure extending through the gate stack and extending in the vertical direction, a word line cut opening that may extend through the gate stack in the vertical direction and may extend in the first direction, and an upper support layer on the gate stack and including a hole portion overlapping the word line cut opening in the vertical direction, wherein an upper surface (e.g., an uppermost surface) of the channel structure is in contact with a lower surface (e.g., a lowermost surface) of the upper support layer.

According to some embodiments of the inventive concept, there is provided an electronic system including a first substrate (e.g., a main substrate), an integrated circuit device on the main substrate, and a controller electrically connected to the integrated circuit device on the main substrate, wherein the integrated circuit device may include a second substrate (e.g., a semiconductor substrate), a peripheral circuit on the semiconductor substrate, an input/output pad electrically connected to the peripheral circuit, a gate stack extending on the peripheral circuit in a first direction that may be parallel to a main surface (e.g., a lower surface) of the semiconductor substrate, the gate stack including a plurality of gate electrodes overlapping each other in a vertical direction perpendicular to the main surface, a channel structure extending through the gate stack and extending in the vertical direction, a word line cut opening that may extend through the gate stack in the vertical direction and may extend in the first direction, and an upper support layer on the gate stack and including a hole portion overlapping the word line cut opening in the vertical direction, wherein an upper surface (e.g., an uppermost surface) of the channel structure is in contact with a lower surface (e.g., a lowermost surface) of the upper support layer.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Hereinafter, some example embodiments of the inventive concept will be described in detail with reference to the accompanying drawings.

Figure 1:
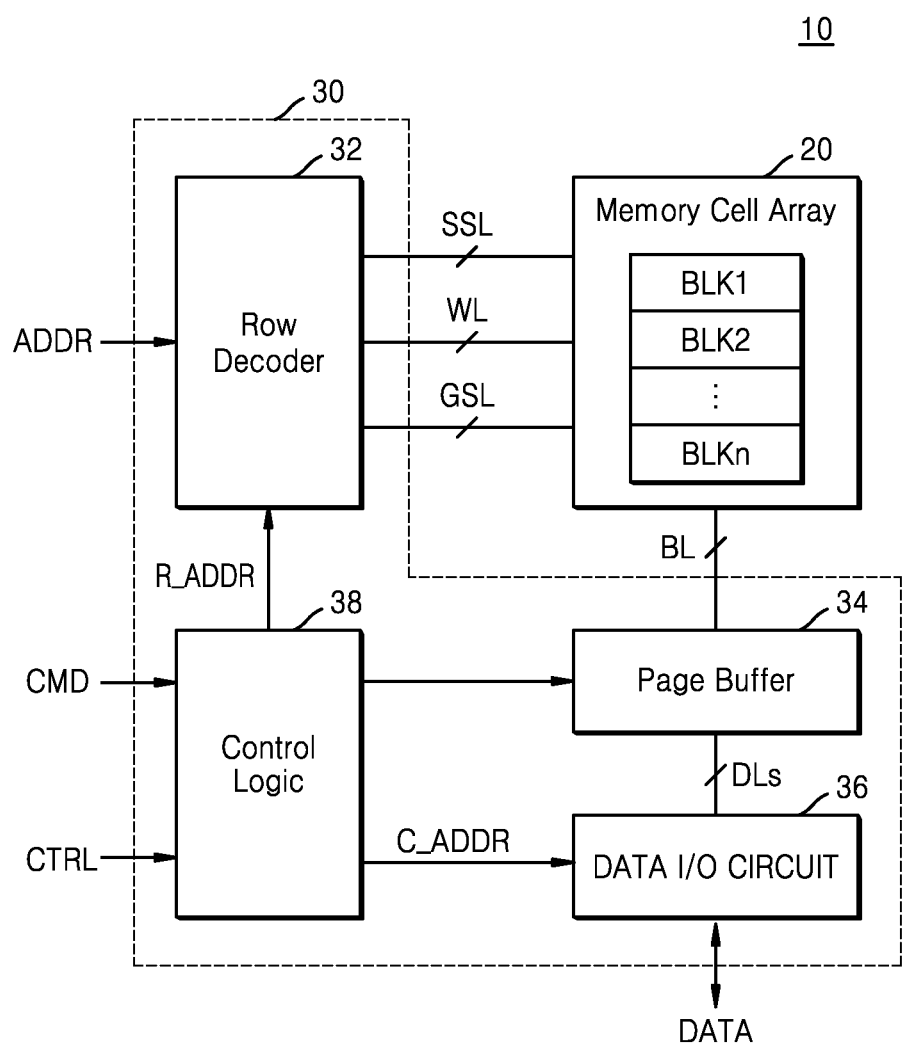
FIG. 1 is a block diagram of an integrated circuit device according to some embodiments of the inventive concept.

FIG. 1 is a block diagram of an integrated circuit device 10 according to some embodiments of the inventive concept.

Referring to FIG. 1, the integrated circuit device 10 may include a memory cell array 20 and a peripheral circuit 30.

The memory cell array 20 may include a plurality of memory cell blocks BLK1, BLK2, . . . , and BLKn (where n is an integer of 3 or more). The plurality of memory cell blocks BLK1, BLK2, . . . , and BLKn may each include a plurality of memory cells. The plurality of memory cell blocks BLK1, BLK2, . . . , and BLKn may be connected to the peripheral circuit 30 through a bit line BL, a word line WL, a string selection line SSL, and a ground selection line GSL.

The memory cell array 20 may be connected to a page buffer 34 through the bit line BL and may be connected to a row decoder 32 through the word line WL, the string selection line SSL, and the ground selection line GSL. In the memory cell array 20, each of the plurality of memory cells included in the plurality of memory cell blocks BLK1, BLK2, . . . , and BLKn may include a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL, which are vertically stacked.

The peripheral circuit 30 may include the row decoder 32, the page buffer 34, a data input/output (I/O) circuit 36, and a control logic 38. Although not shown in the drawings, the peripheral circuit 30 may further include various circuits such as a voltage generating circuit for generating various voltages for an operation of the integrated circuit device 10, an error correction circuit for correcting an error of data read from the memory cell array 20, and an I/O interface.

The peripheral circuit 30 may receive an address ADDR, a command CMD, and a control signal CTRL from the outside of the integrated circuit device 10 and may transmit and receive data DATA to and from an external device outside the integrated circuit device 10.

A configuration of the peripheral circuit 30 will be described below in detail.

The row decoder 32 may select at least one memory cell block from among the plurality of memory cell blocks BLK1, BLK2, . . . , and BLKn in response to the address ADDR from the outside and may select a word line WL, a string selection line SSL, and a ground selection line GSL of the selected memory cell block. The row decoder 32 may provide the word line WL of the selected memory cell block with a voltage for performing a memory operation.

The page buffer 34 may be connected to the memory cell array 20 through the bit line BL. In a program operation, the page buffer 34 may operate as a write driver to apply a voltage, based on the data DATA which is to be stored in the memory cell array 20, to the bit line BL, and in a read operation, the page buffer 34 may operate as a sense amplifier to sense the data DATA stored in the memory cell array 20. The page buffer 34 may operate based on the control signal CTRL provided to the control logic 38.

The data I/O circuit 36 may be connected to the page buffer 34 through a plurality of data lines DLs. In a program operation, the data I/O circuit 36 may receive the data DATA from a memory controller (not shown), and based on a column address C_ADDR provided from the control logic 38, the data I/O circuit 36 may provide program data DATA to the page buffer 34. In a read operation, the data I/O circuit 36 may provide the memory controller with read data DATA stored in the page buffer 34 on the basis of the column address C_ADDR provided from the control logic 38. The data I/O circuit 36 may transfer an address or a command, input thereto, to the control logic 38 or the row decoder 32.

The control logic 38 may receive the command CMD and the control signal CTRL from the memory controller. The control logic 38 may provide a row address R_ADDR to the row decoder 32 and may provide the column address C_ADDR to the data I/O circuit 36. The control logic 38 may generate various internal control signals used in the integrated circuit device 10 in response to the control signal CTRL. For example, the control logic 38 may adjust a voltage level provided to the word line WL and the bit line BL in performing a memory operation such as a program operation or an erase operation.

Figure 2:
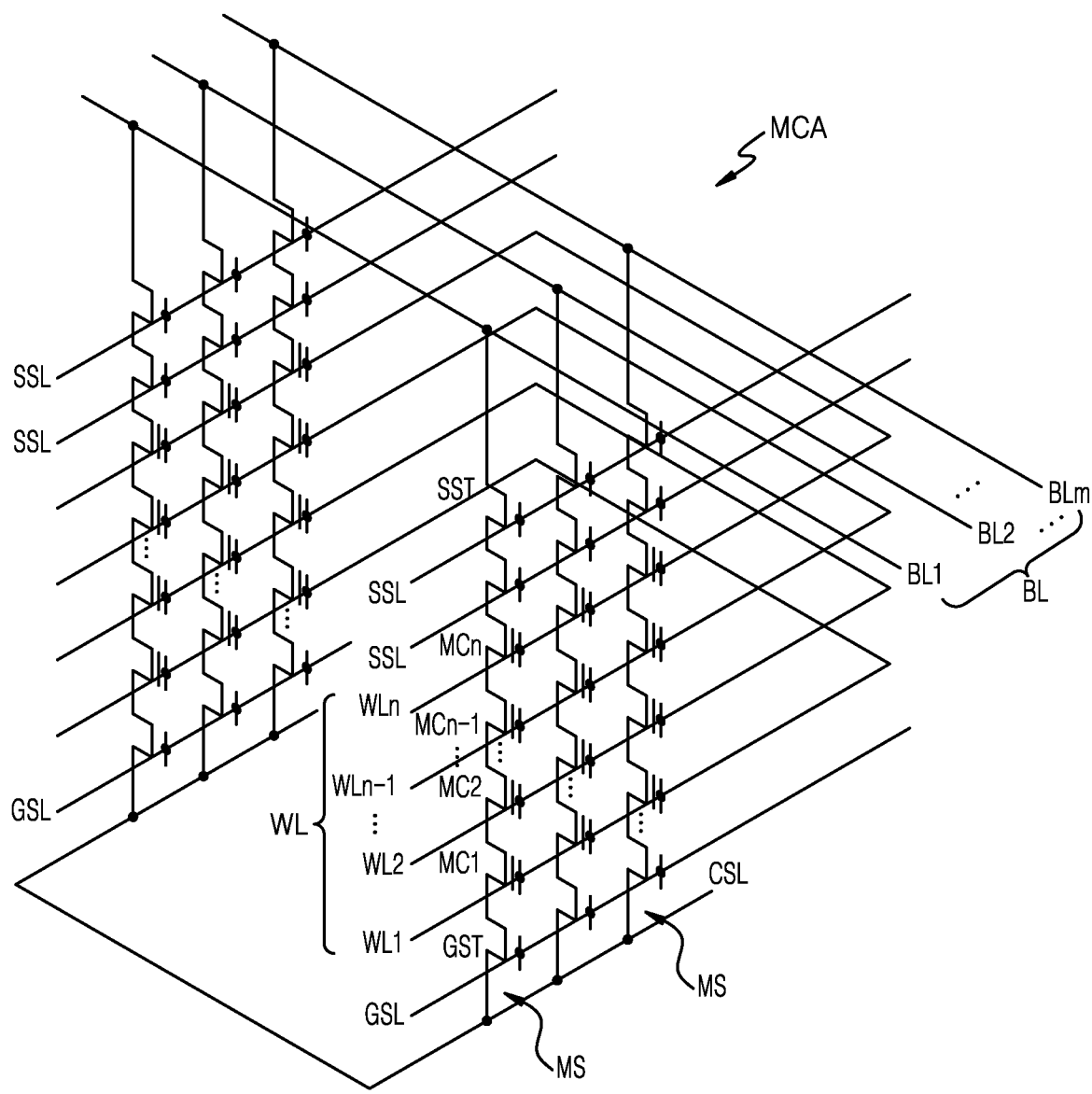
FIG. 2 is an equivalent circuit diagram of a memory cell array of an integrated circuit device according to some embodiments of the inventive concept.

FIG. 2 is an equivalent circuit diagram of a memory cell array MCA of an integrated circuit device according to some embodiments of the inventive concept.

Referring to FIG. 2, an equivalent circuit diagram of a vertical NAND flash memory having a vertical channel structure is illustrated.

The memory cell array MCA may include a plurality of memory cell strings MS. The memory cell array MCA may include a plurality of bit lines BL, a plurality of word lines WL, at least one string selection line SSL, at least one ground selection line GSL, and a common source line CSL.

A plurality of memory cell strings MS may be formed between the plurality of bit lines BL and the common source line CSL. In the drawing, an example where each of the plurality of memory cell strings MS includes two string selection lines SSL is illustrated, but the inventive concept is not limited thereto. For example, the plurality of memory cell strings MS may each include one string selection line SSL or three or more string selection lines SSL.

The plurality of memory cell strings MS may each include a string selection transistor SST, a ground selection transistor GST, and a plurality of memory cell transistors MC1, MC2, . . . , MCn−1, and MCn. A drain region of the string selection transistor SST may be connected to a bit line BL, and a source region of the ground selection transistor GST may be connected to the common source line CSL. The common source line CSL may be a region which is connected to source regions of a plurality of ground selection transistors GST in common.

The string selection transistor SST may be connected to the string selection line SSL, and the ground selection transistor GST may be connected to the ground selection line GSL. The plurality of memory cell transistors MC1, MC2, . . . , MCn−1, and MCn may be respectively connected to a plurality of word lines WL.

Figure 3:
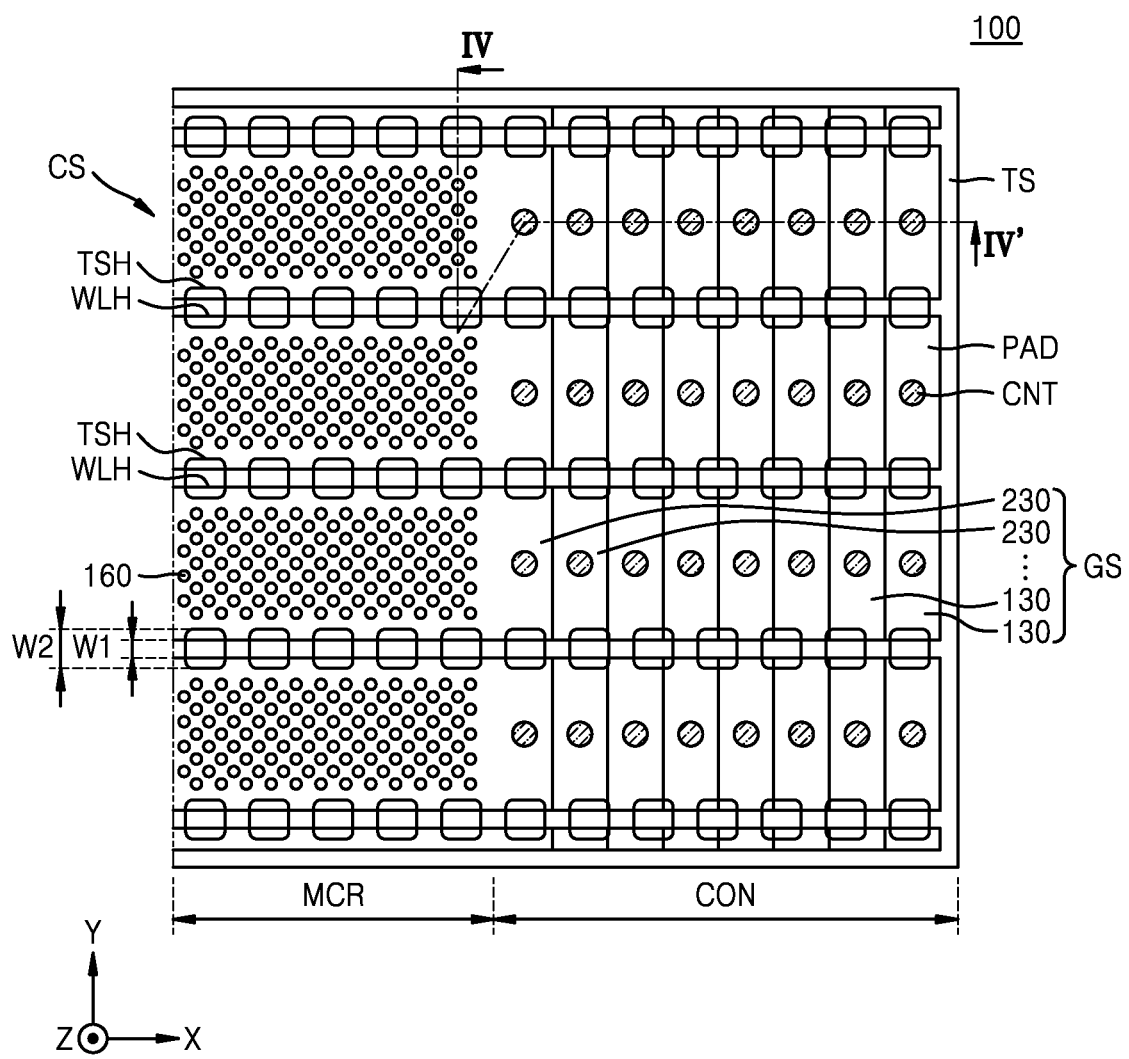
FIG. 3 is a plan view illustrating an integrated circuit device according to some embodiments of the inventive concept.
Figure 4:
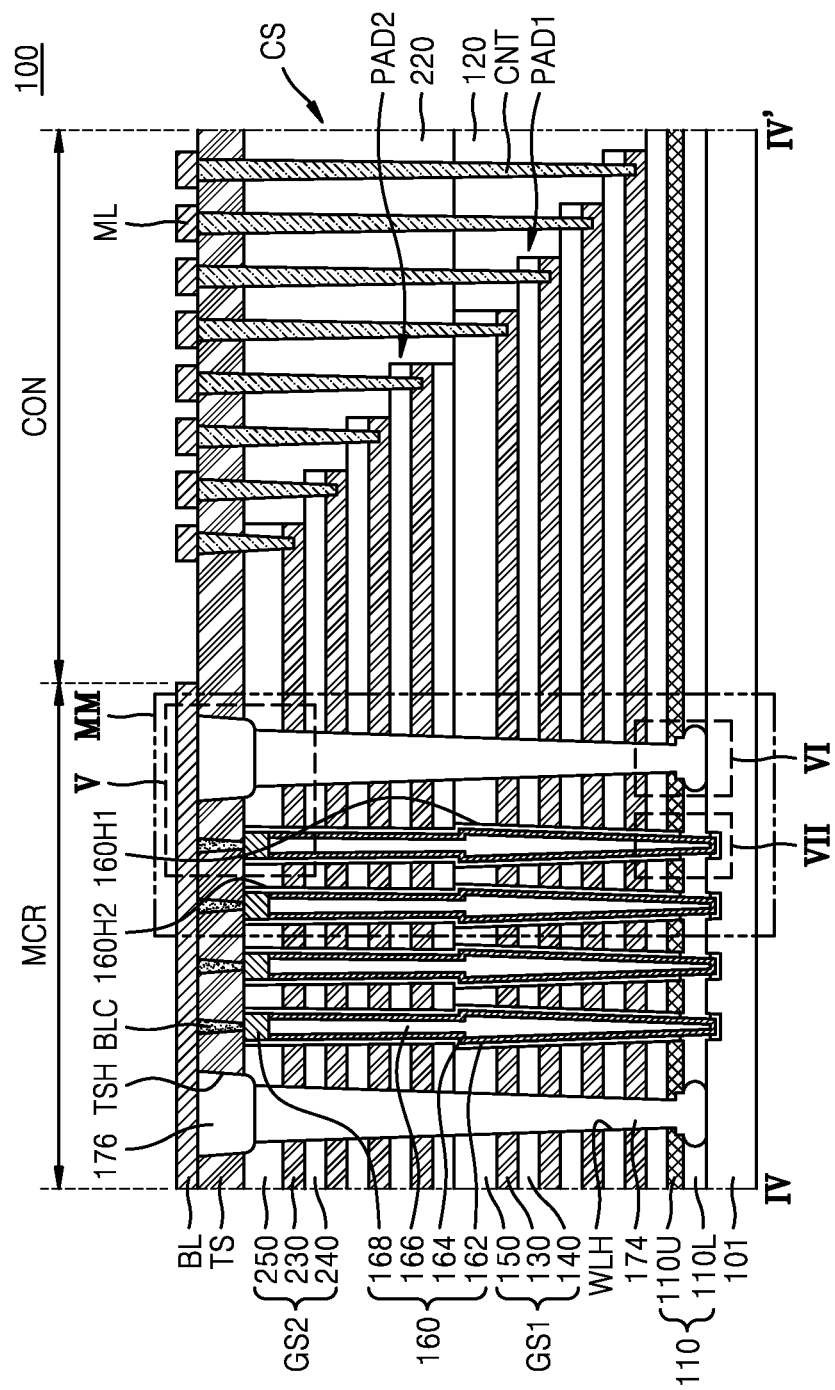
FIG. 4 is a cross-sectional view taken along a line IV-IV' of FIG. 3.
Figure 5:
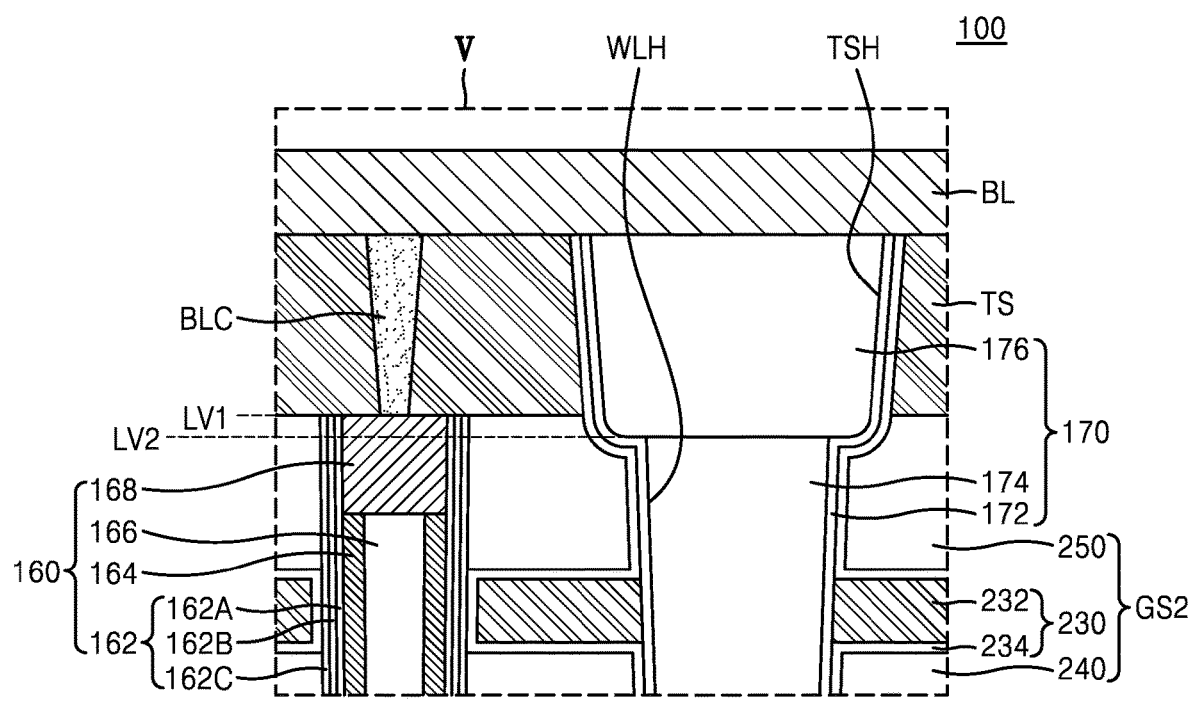
FIG. 5 is an enlarged view of a portion V of FIG. 4.
Figure 6:
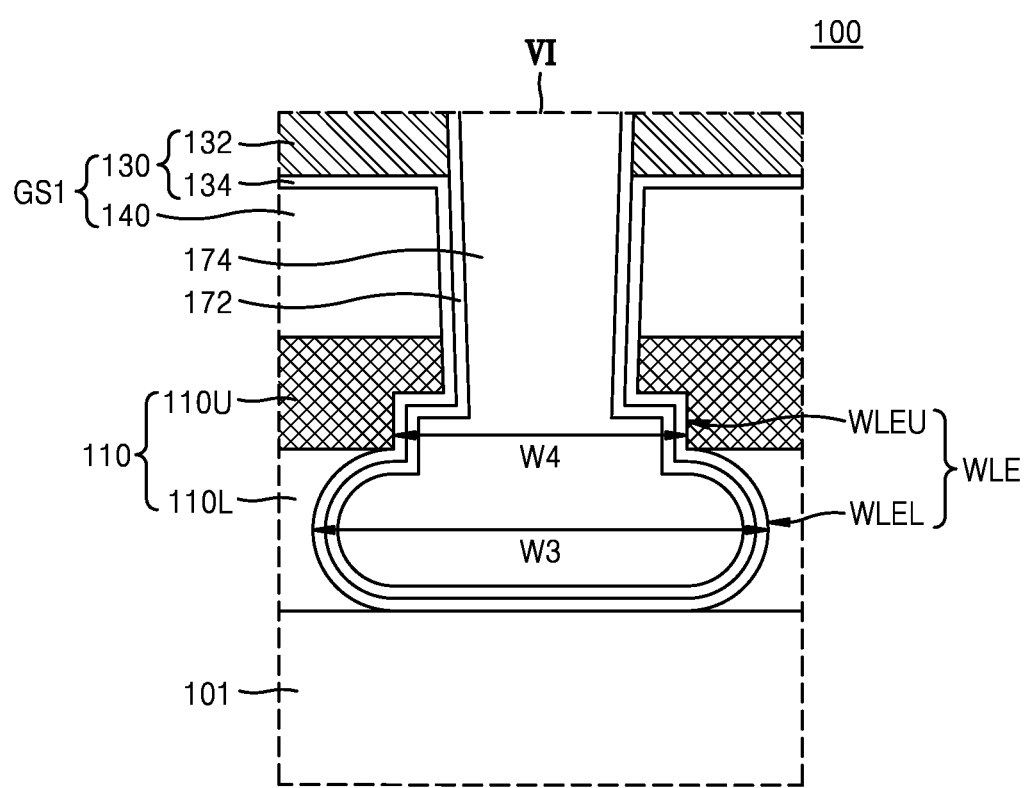
FIG. 6 is an enlarged view of a portion VI of FIG. 4.
Figure 7:
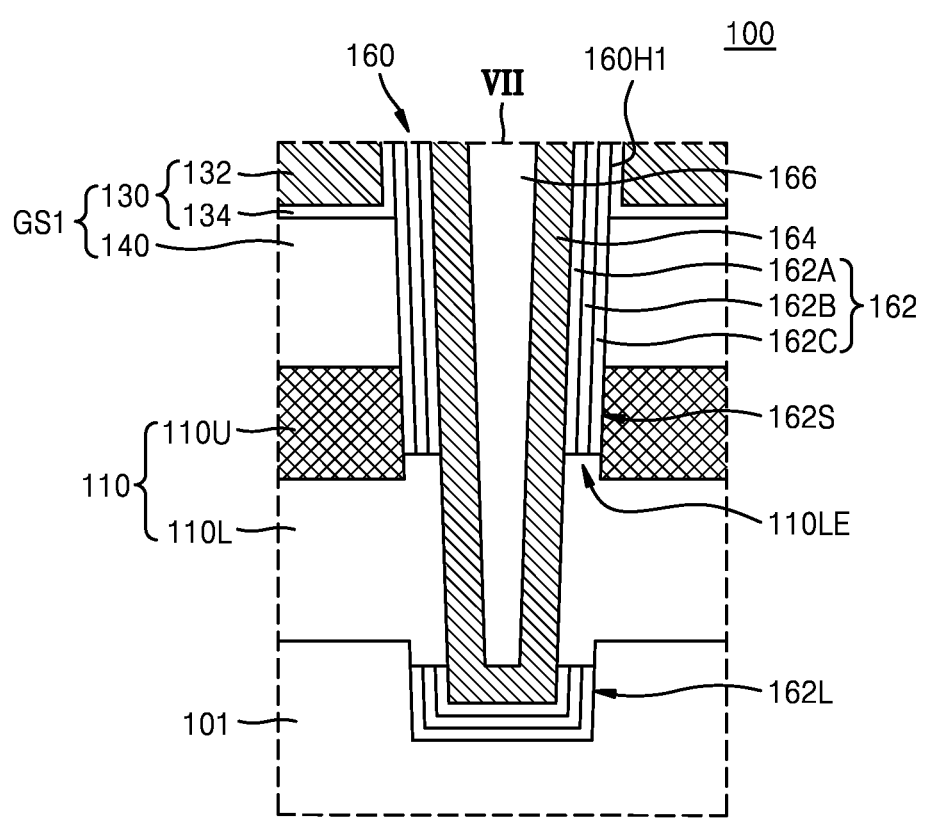
FIG. 7 is an enlarged view of a portion VII of FIG. 4.

FIG. 3 is a plan view illustrating an integrated circuit device 100 according to some embodiments of the inventive concept, FIG. 4 is a cross-sectional view taken along a line IV-IV' of FIG. 3, FIG. 5 is an enlarged view of a portion V of FIG. 4, FIG. 6 is an enlarged view of a portion VI of FIG. 4, and FIG. 7 is an enlarged view of a portion VII of FIG. 4.

Referring to FIGS. 3 to 7, the integrated circuit device 100 may include a cell array structure CS including a memory cell region MCR and a connection region CON.

The memory cell region MCR may be an area in which the memory cell array MCA of a vertical channel structure NAND-type described with reference to FIG. 2 is formed. The connection region CON may be an area in which a pad portion PAD for electrical connection between the memory cell array MCA formed in the memory cell region MCR and a peripheral circuit area (not shown) is formed.

A substrate 101 may be a semiconductor substrate 101 that may include a semiconductor material, for example, a group IV semiconductor, a group III-V compound semiconductor, or a group II-VI oxide semiconductor. For example, the group IV semiconductor may include silicon (Si), germanium (Ge), or silicon-germanium. The semiconductor substrate 101 may be provided as a bulk wafer or a wafer on which an epitaxial layer is formed. In some embodiments, the semiconductor substrate 101 may include a silicon on insulator (SOI) substrate or a germanium on insulator (GeOI) substrate.

A base structure 110 may be arranged on the semiconductor substrate 101. In some embodiments, the base structure 110 may function as a source region supplying current to vertical memory cells formed in the cell array structure CS. The semiconductor substrate 101 may include opposing surfaces, an upper surface and a lower surface, and, in some embodiments, the base structure 110 may contact the upper surface of the semiconductor substrate 101 as illustrated in FIG. 4. One of the upper surface and the lower surface of the semiconductor substrate 101 may be a main surface of the semiconductor substrate 101.

The base structure 110 may include a lower base layer 110L and an upper base layer 110U sequentially stacked on the semiconductor substrate 101. In some embodiments, the lower base layer 110L may include polysilicon doped with impurities or polysilicon not doped with impurities, and the upper base layer 110U may also include polysilicon doped with impurities or polysilicon not doped with impurities. In some embodiments, both the lower base layer 110L and the upper base layer 110U may include a semiconductor material such as silicon. The upper base layer 110U may function as a support layer to reduce or possibly prevent collapse or fall of a mold stack in a process of removing a sacrificial material layer for forming the lower base layer 110L. The lower base layer 110L may correspond to the common source line CSL described above with reference to FIG. 2.

A gate stack GS may extend on the base structure 110 in a first direction (X direction) and a second direction (Y direction), which are parallel to the upper surface of the base structure 110. The gate stack GS may include a first gate stack GS1 in a lower portion of the gate stack GS and a second gate stack GS2 in an upper portion of the gate stack GS. As used herein, "an element A extends in a direction X" (or similar language) may mean that the element A extends longitudinally in the direction X.

The first gate stack GS1 may include a plurality of first gate electrodes 130 and a plurality of first insulating layers 140, and the plurality of first gate electrodes 130 and the plurality of first insulating layers 140 may be alternately arranged in a third direction (Z direction) that is perpendicular to the upper surface of the base structure 110. In addition, a first upper insulating layer 150 may be arranged in the uppermost portion of the first gate stack GS1. The second gate stack GS2 may include a plurality of second gate electrodes 230 and a plurality of second insulating layers 240, and the plurality of second gate electrodes 230 and the plurality of second insulating layers 240 may be alternately arranged on the first gate stack GS1 in the third direction (Z direction). In addition, a second upper insulating layer 250 may be arranged in the uppermost portion of the second gate stack GS2.

Each of the first gate electrodes 130 may include a buried conductive layer 132 and an insulating liner 134 surrounding the upper surface, bottom surface, and side surfaces of the buried conductive layer 132. For example, the buried conductive layer 132 may include a metal such as tungsten, nickel, cobalt, or tantalum, a metal silicide such as tungsten silicide, nickel silicide, cobalt silicide, or tantalum silicide, doped polysilicon, or a combination thereof. In some embodiments, a conductive barrier layer (not shown) surrounding the upper surface and side surfaces of the buried conductive layer 132 may be further formed. The conductive barrier layer may include titanium nitride, tantalum nitride, tungsten nitride, or a combination thereof. In some embodiments, the insulating liner 134 may include a high-k material such as aluminum oxide.

Each of the second gate electrodes 230 may include a buried conductive layer 232 and an insulating liner 234 surrounding the upper surface, bottom surface, and side surfaces of the buried conductive layer 232. In some embodiments, the material of the first gate electrode 130 and the material of the second gate electrode 230 may be substantially the same.

The plurality of first and second gate electrodes 130 and 230 may correspond to a ground selection line GSL, a word line WL, and at least one string selection line SSL, which constitute the memory cell string MS described above with reference to FIG. 2. For example, the lowermost one of the plurality of first gate electrodes 130 may function as the ground selection line GSL, the uppermost one of the plurality of second gate electrodes 230 may function as the string selection line SSL, and the remaining first and second gate electrodes 130 and 230 may function as word lines WL. Accordingly, a memory cell string MS in which the ground selection transistor GST, the selection transistor SST, and the memory cell transistors MC1, MC2, . . . , MCn−1, and MCn are connected in series may be provided. In some embodiments, at least one of the first and second gate electrodes 130 and 230 may function as a dummy word line. However, the inventive concept is not limited thereto.

On the base structure 110, a plurality of word line cuts 170 may extend in the first direction (X direction) parallel to the upper surface of the base structure 110. A gate stack GS arranged between a pair of word line cuts 170 may constitute one block, and the pair of word line cuts 170 may define a width of the gate stack GS in the second direction (Y direction). Each of the word line cuts 170 may include an insulating spacer 172, an insulating separation layer 174, and an upper buried layer 176. That is, the word line cut 170 may include an insulating structure.

The insulating separation layer 174 filling the interior of a word line cut opening WLH may be arranged on the base structure 110. The insulating separation layer 174 may include, for example, silicon oxide, silicon nitride, silicon oxynitride, and/or a low dielectric material. The insulating separation layer 174 may be referred to as a first insulating structure. "An element A filling an element B" (or similar language) as used herein may mean that the element A is in the element B but does not necessarily mean that the element A fills the element B entirely. As used herein the term "and/or" includes any and all combinations of one or more of the associated listed items.

A plurality of channel structures 160 may extend in the third direction (Z direction) through the first and second gate electrodes 130 and 230 from the upper surface of the base structure 110 in a memory cell region MCR. The plurality of channel structures 160 may be arranged to be spaced apart from each other at certain intervals in the first direction (X direction) and the second direction (Y direction). The plurality of channel structures 160 may be arranged in a zigzag shape or a staggered shape.

Each of the plurality of channel structures 160 may be formed in a first channel hole 160H1 passing through the first gate stack GS1 and in a second channel hole 160H2 passing through the second gate stack GS2. Each of the plurality of channel structures 160 may have a shape protruding outward from a boundary portion between the first channel hole 160H1 and the second channel hole 160H2.

Each of the plurality of channel structures 160 may include a gate insulating layer 162, a channel layer 164, a buried insulating layer 166, and a conductive plug 168. The gate insulating layer 162 and the channel layer 164 may be sequentially stacked on the sidewalls of the first and second channel holes 160H1 and 160H2. For example, the gate insulating layer 162 may be conformally formed on the sidewalls of the first and second channel holes 160H1 and 160H2, and the channel layer 164 may be conformally formed on the sidewalls and bottom of the first and second channel holes 160H1 and 160H2. In some embodiments, each of the gate insulating layer 162 and the channel layer 164 may have a uniform thickness on the sidewalls of the first and second channel holes 160H1 and 160H2 as illustrated in FIGS. 4 and 5. The buried insulating layer 166 may be arranged on the channel layer 164 to fill the remaining spaces of the first and second channel holes 160H1 and 160H2. The conductive plug 168 may be arranged at the upper side of the second channel hole 160H2 to contact the channel layer 164 and block the inlet (e.g., the uppermost end) of the second channel hole 160H2. In some embodiments, the buried insulating layer 166 may be omitted, and the channel layer 164 may have a pillar shape filling the remaining portions of the first and second channel holes 160H1 and 160H2.

The plurality of channel structures 160 may pass through the upper base layer 110U and the lower base layer 110L to contact the semiconductor substrate 101. In some embodiments, a portion of the gate insulating layer 162, which is at a level the same as or similar to the lower base layer 110L, may be removed and the channel layer 164 may contact an extension portion 110LE of the lower base layer 110L as illustrated in FIG. 7. A sidewall portion 162S and a bottom portion 162L of the gate insulating layer 162 may be arranged to be spaced apart from each other with the extension portion 110LE of the lower base layer 110L therebetween, and the bottom portion 162L of the gate insulating layer 162 may be arranged to surround the bottom surface of the channel layer 164. Therefore, the channel layer 164 may be electrically connected to the lower base layer 110L instead of directly contacting the semiconductor substrate 101.

In some embodiments, the channel layer 164 may be arranged at the bottom of the first channel hole 160H1 to contact the upper surface of the base structure 110. In contrast, a contact semiconductor layer (not shown) having a certain height may be further formed on the base structure 110 at the bottom of the first channel hole 160H1, and the channel layer 164 may be electrically connected to the base structure 110 through the contact semiconductor layer.

The gate insulating layer 162 may have a structure including a tunneling dielectric layer 162A, a charge storage layer 162B, and a blocking dielectric layer 162C sequentially stacked on an outer wall of the channel layer 164. The relative thicknesses of the tunneling dielectric layer 162A, the charge storage layer 162B, and the blocking dielectric layer 162C of the gate insulating layer 162 are not limited to those illustrated in the drawings and may be variously modified.

The tunneling dielectric layer 162A may include, for example, silicon oxide, hafnium oxide, aluminum oxide, zirconium oxide, and/or tantalum oxide. The charge storage layer 162B is a region in which electrons passing through the tunneling dielectric layer 162A from the channel layer 164 may be stored, and may include, for example, silicon nitride, boron nitride, silicon boron nitride, and/or polysilicon doped with impurities. The blocking dielectric layer 162C may include, for example, silicon oxide, silicon nitride, and/or a metal oxide having a higher dielectric constant than silicon oxide (e.g., silicon dioxide $SiO_2$). The metal oxide may include hafnium oxide, aluminum oxide, zirconium oxide, and/or tantalum oxide.

In one block, the uppermost one of the second gate electrodes 230 may be divided into two portions in plan by a string separation-insulating layer (not shown). The two portions may form the string selection line SSL described above with reference to FIG. 2.

In the connection region CON, the first gate stack GS1 may extend to form a first pad portion PAD1, and a first cover insulating layer 120 covering the first pad portion PAD1 may be arranged. In addition, the second gate stack GS2 may extend to form a second pad portion PAD2, and a second cover insulating layer 220 covering the second pad portion PAD2 may be arranged.

In the connection region CON, the plurality of first and second gate electrodes 130 and 230 may extend to have a shorter length in the first direction (X direction) as the plurality of first and second gate electrodes 130 and 230 are away from the upper surface of the base structure 110. In the connection region CON, a contact structure CNT, which passes through the first and second cover insulating layers 120 and 220 and is connected to the first and second gate electrodes 130 and 230, may be arranged. As used herein, "an element A covers a surface of an element B" (or similar language) means that the element A is on and overlaps the surface of the element B but does not necessarily mean that the element A covers the surface of the element B entirely.

Although not shown in the drawings, a plurality of dummy channel structures, which pass through the gate stack GS from the upper surface of the base structure 110 in the connection region CON and extend in the third direction (Z direction), may be further formed. The dummy channel structures may be formed to reduce or possibly prevent bending or warping of the gate stack GS in a process of manufacturing the integrated circuit device 100 and to improve or secure structural stability of the gate stack GS.

As the height of the gate stack GS increases, the aspect ratio of the word line cut opening WLH, that is, the ratio of the height of the gate stack GS to the width of the word line cut opening WLH, may increase. In particular, in a multi-stage structure in which the gate stack GS includes the first and second gate stacks GS1 and GS2, the aspect ratio of the word line cut opening WLH may further increase. Accordingly, defects due to bending or warping of the gate stack GS may occur in a process of forming the gate stack GS or a process of forming a bit line contact BLC and the contact structure CNT.

An upper support layer TS may be arranged on the second gate stack GS2 to address this problem. The upper support layer TS may include a plurality of hole portions TSH, and the plurality of hole portions TSH may be arranged to vertically overlap the word line cut opening WLH. The upper support layer TS may impart structural stability to the gate stack GS during a process of manufacturing the integrated circuit device 100 and thus may reduce or prevent process defects caused by bending or warping of the gate stack GS.

The upper support layer TS may be formed to contact the uppermost surface of the channel structure 160 and the upper surface of the second upper insulating layer 250. That is, another material layer may not be arranged between the second gate stack GS2 and the upper support layer TS. As used herein, "an element A vertically overlapping an element B" (or similar language) may mean that at least one vertical line can be drawn that intersects both elements A and B.

The upper buried layer 176 may fill the interior of the plurality of hole portions TSH. In some embodiments, the upper buried layer 176 may include the same material as the insulating separation layer 174. The upper support layer TS and the upper buried layer 176 may each include, for example, silicon oxide and/or silicon oxynitride. The upper buried layer 176 may be referred to as a second insulating structure.

The insulating spacer 172 covering the sidewall of the buried conductive layer 132 and the sidewall of the insulating liner 134 may extend on the inner wall of the word line cut opening WLH and the inner walls of the plurality of hole portions TSH and be conformally arranged.

A first width W1 of the word line cut opening WLH in the second direction may be less than a second width W2 of each of the hole portions TSH in the second direction. In some embodiments, the first width W1 and the second width W2 may not be uniform along the third direction as illustrated in FIG. 4. The first width W1 may be a widest width of the word line cut opening WLH or a width of an uppermost portion of the word line cut opening WLH, and the second width W2 may be a narrowest width of each of the hole portions TSH or a width of a lowermost portion of each of the hole portions TSH. As will be described later, a process of manufacturing the hole portion TSH may be performed such that over-etching is performed up to the second upper insulating layer 250. Accordingly, the hole portion TSH may be formed up to a portion of the second upper insulating layer 250 while having the second width W2.

An expansion portion WLE protruding laterally at the same level as the base structure 110 may be formed in a lower portion of the word line cut opening WLH. For example, the lowermost surface of the word line cut opening WLH may be arranged at substantially the same level as the bottom surface of the lower base layer 110L. The expansion portion WLE may include a lower expansion portion WLEL and an upper expansion portion WLEU. Specifically, the word line cut opening WLH may include a lower expansion portion WLEL protruding laterally at the same level as the lower base layer 110L and an upper expansion portion WLEU protruding laterally at the same level as the upper base layer 110U. A third width W3 of the lower expansion portion WLEL in a lateral direction may be greater than a fourth width W4 of the upper expansion portion WLEU in the lateral direction. Accordingly, a lower portion of the word line cut opening WLH in the base structure 110 may have a step shape. In some embodiments, the third width W3 may not be uniform along the third direction as illustrated in FIGS. 4 and 6, and the fourth width W4 may not be uniform along the third direction. The third width W3 may be a widest width of the lower expansion portion WLEL, and the fourth width W4 may be a widest width of the upper expansion portion WLEU or a width of a lowermost portion of the upper expansion portion WLEU.

The lower expansion portion WLEL may be formed over the entire height (i.e., from the bottom surface to the upper surface) of the lower base layer 110L. That is, the height of the lower expansion portion WLEL may be substantially the same as the thickness of the lower base layer 110L. On the other hand, the upper expansion portion WLEU may be formed over a partial height (i.e., from the bottom surface to the middle) of the upper base layer 110U. That is, the height of the upper expansion portion WLEU may be less than the thickness of the upper base layer 110U. However, the height of the upper expansion portion WLEU is not limited thereto.

The bit line contact BLC may pass through the upper support layer TS to contact the conductive plug 168 of the channel structure 160, and on the upper support layer TS, a bit line BL contacting the bit line contact BLC may extend in the second direction (Y direction). In addition, a conductive line ML may be formed on the upper support layer TS in the connection region CON. Although not shown in the drawings, an additional insulating layer may be further formed between the upper support layer TS and the bit line BL, and between the upper support layer TS and the conductive line ML.

The uppermost surface of the channel structure 160 may be in contact with the lowermost surface of the upper support layer TS. In other words, the upper surface of the conductive plug 168 may be in contact with the lowermost surface of the upper support layer TS. That is, an additional material layer may not be arranged on the channel structure 160, and the upper support layer TS may be arranged immediately thereon.

In addition, as described above, the hole portion TSH may be formed up to a portion of the second upper insulating layer 250. Accordingly, a level LV1 of the uppermost surface of the channel structure 160 may be higher than a level LV2 of the lowermost surface of each of the plurality of hole portions TSH. In some embodiments, a portion of the hole portion TSH may protrude into the second gate stack GS2 (e.g., the second upper insulating layer 250) and thus may be in the second gate stack GS2 as illustrated in FIG. 5. The hole portion TSH may define a recess in an upper surface of the second gate stack GS2, and the recess of the second gate stack GS2 may be recessed toward the semiconductor substrate 101 beyond the upper surface of the uppermost surface of the channel structure 160 as illustrated in FIG. 5. As used herein, "a surface V is higher than a surface W" (or similar language) may mean that the surface W is closer than the surface V to a substrate, and the surface W is lower than the surface V relative to the substrate (e.g., semiconductor substrate 101).

When an etching process of forming the word line cut opening WLH is performed after a process of forming the channel structure 160 in the first and second channel holes 160H1 and 160H2 is completely performed, positive charges may be accumulated in a conductive material in the previously formed channel structure 160, and plasma ions generated in the etching process may be tilted in an undesired direction due to the positive charges. Accordingly, in the etching process, the word line cut opening WLH may be expanded toward the channel structure 160, and the word line cut opening WLH and the channel structure 160 may contact each other, resulting in defects such as leakage current. These defects may be more problematic when the aspect ratio of the word line cut opening WLH increases as the height of the gate stack GS increases.

According to some embodiments of the inventive concept, an insulating sacrificial layer 160S (see FIG. 10C) is first filled in a channel hole 160H (see FIG. 10C) instead of a conductive material layer, and then the word line cut opening WLH is etched. In this case, because positive charges are not accumulated in the insulating sacrificial layer 160S (see FIG. 10C) in the previously formed channel hole 160H, a phenomenon in which plasma ions generated in the etching process are tilted in an undesired direction may not occur.

According to some embodiments of the inventive concept, there is an insulating sacrificial layer 160S in the channel hole 160H, and thus the channel structure 160 may not be affected by factors such as over-etching or misalignment that may occur in the process of forming the hole portion TSH in the upper support layer TS. Therefore, the upper support layer TS may be formed without the arrangement of an additional material layer on the channel structure 160, thereby reducing the overall height of the cell array structure CS.

According to some embodiments of the inventive concept, after the word line cut opening WLH is etched, a blocking oxide layer is formed in a lower portion of the word line cut opening WLH and accordingly, a lower portion of the word line cut opening WLH may have a step shape within the base structure 110.

According to some embodiments of the inventive concept, because an insulating sacrificial layer 160S is first filled in the channel hole 160H instead of a conductive material layer in a vertical memory device, and then the word line cut opening WLH is etched, there is an effect of reducing or suppressing the occurrence of defects due to tilting of plasma ions during the etching process, and thus, excellent electrical characteristics may be provided.

Figure 8:
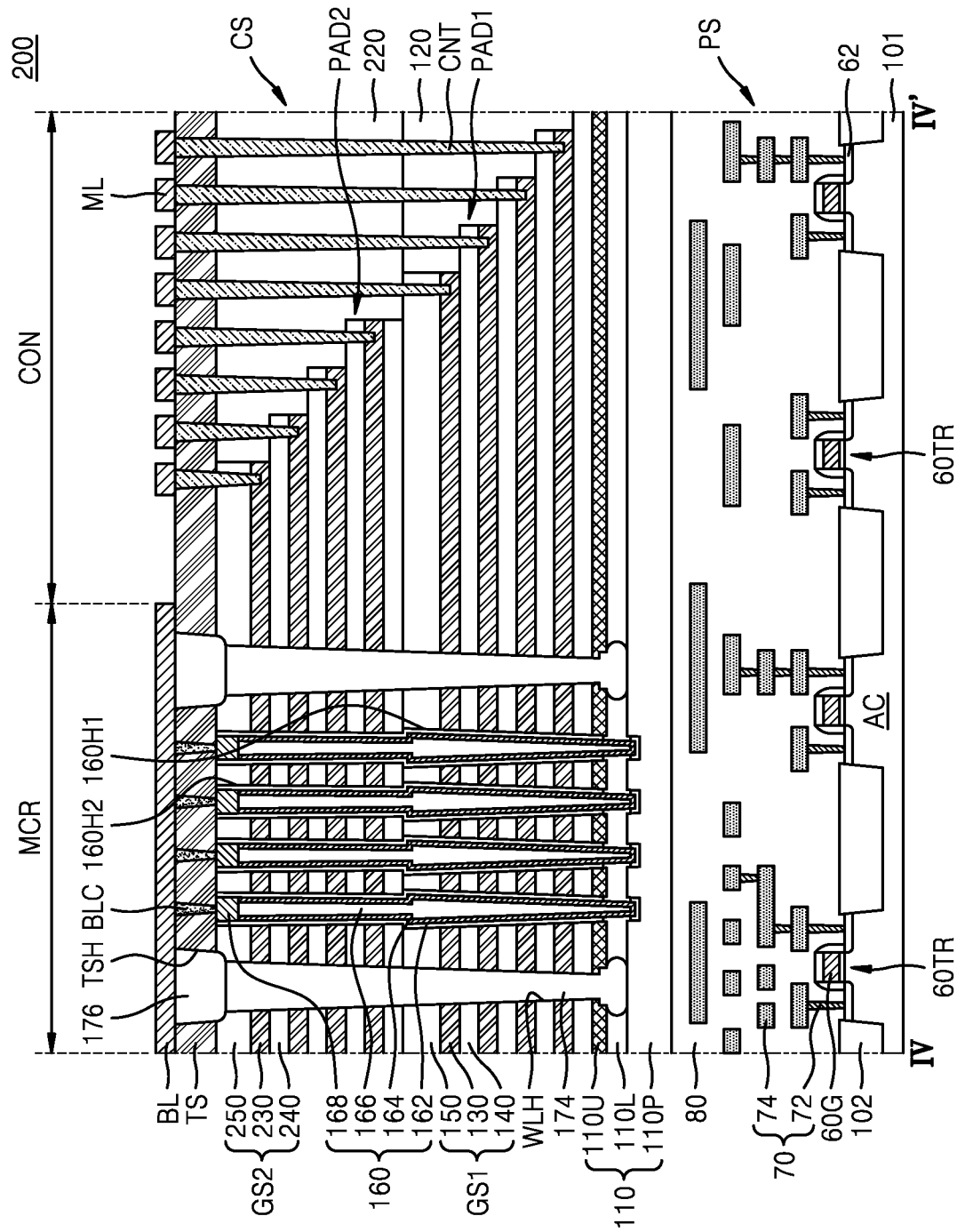
FIGS. 8 and 9 are cross-sectional views of integrated circuit devices according to some embodiments of the inventive concept, respectively.
Figure 9:
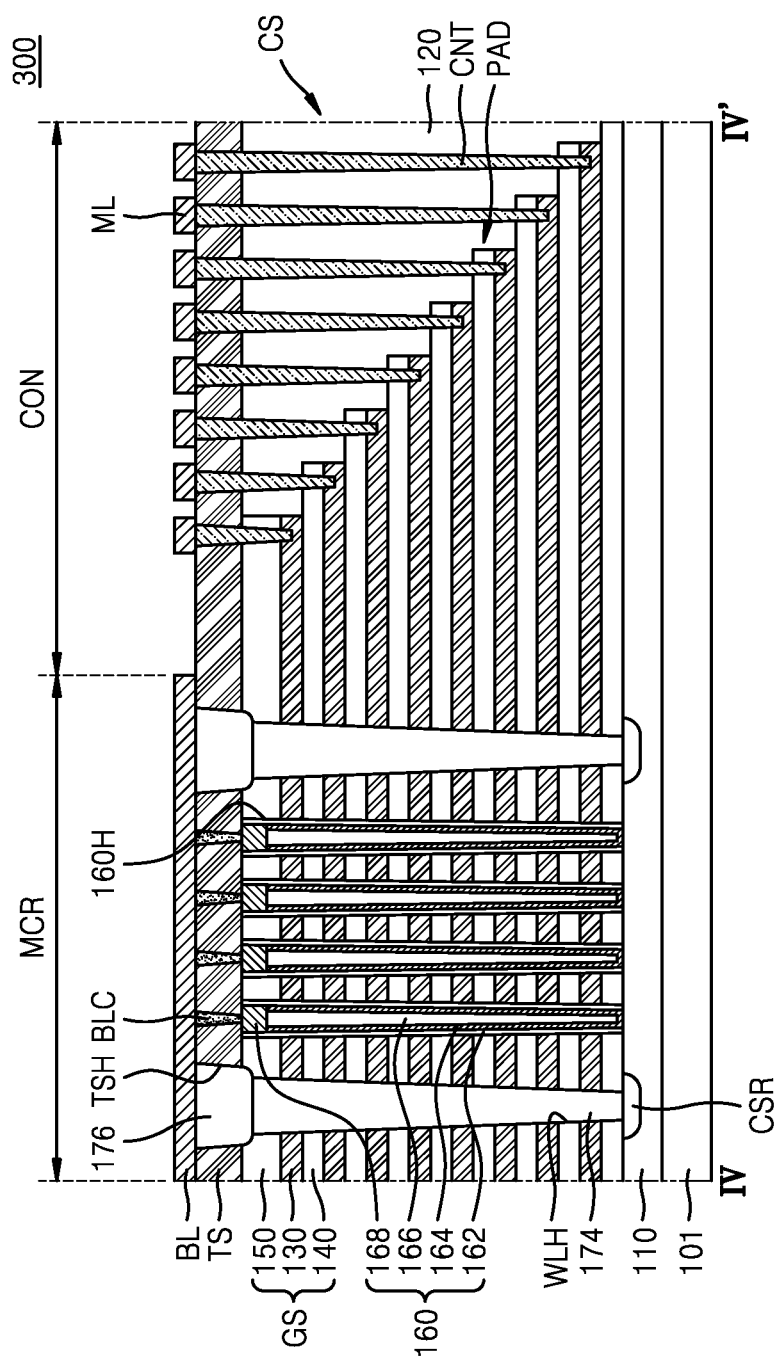

FIGS. 8 and 9 are cross-sectional views of integrated circuit devices 200 and 300 according to some embodiments of the inventive concept, respectively.

Most elements of the integrated circuit devices 200 and 300 described below and materials included in the elements are substantially the same as or similar to those described above with reference to FIGS. 3 to 7. Therefore, for convenience of description, descriptions may be made focusing on differences from the integrated circuit device 100 described above.

Referring to FIG. 8, the integrated circuit device 200 may include a peripheral circuit structure PS and a cell array structure CS arranged at a higher vertical level than the peripheral circuit structure PS.

The integrated circuit device 200 may have a cell on periphery (COP) structure in which the cell array structure CS is arranged on the peripheral circuit structure PS.

The peripheral circuit structure PS may include a peripheral circuit transistor 60TR and a peripheral circuit wiring 70, which are arranged on a semiconductor substrate 101. In the semiconductor substrate 101, an active region AC may be defined by a device isolation layer 102, and a plurality of peripheral circuit transistors 60TR may be formed on the active region AC. The plurality of peripheral circuit transistors 60TR may each include a peripheral circuit gate 60G and source/drain regions 62 arranged in a portion of the semiconductor substrate 101 on both sides of the peripheral circuit gate 60G.

The peripheral circuit wiring 70 may include a plurality of peripheral circuit contacts 72 and a plurality of peripheral circuit metal layers 74. An interlayer insulating layer 80 covering the peripheral circuit transistor 60TR and the peripheral circuit wiring 70 may be arranged on the semiconductor substrate 101. The plurality of peripheral circuit metal layers 74 may have a multilayer structure including a plurality of metal layers arranged at different vertical levels. In the drawing, it is shown that the plurality of peripheral circuit metal layers 74 have the same height. However, unlike this, peripheral circuit metal layers 74 arranged at some levels (e.g., arranged at the top level) may be formed to have a higher height than peripheral circuit metal layers 74 arranged at the other levels. In some embodiments, the peripheral circuit metal layers 74 may have different thicknesses.

A base structure 110 may be arranged on the interlayer insulating layer 80. The base structure 110 may include a base plate 110P, a lower base layer 110L, and an upper base layer 110U sequentially stacked on the peripheral circuit structure PS. The base plate 110P may include a semiconductor material such as silicon.

Referring to FIG. 9, the integrated circuit device 300 may include a cell array structure CS including a memory cell region MCR and a connection region CON.

The integrated circuit device 300 may include only one gate stack GS. That is, the integrated circuit device 300 may include a gate stack GS having a single-stage structure rather than a multi-stage structure of a two-layer stack. Accordingly, a channel hole 160H may have a tapered shape that is monotonically widened in the third direction (Z direction) as a distance from the semiconductor substrate 101 increases.

A common source line may be formed in a word line cut opening WLH. In this case, a common source region CSR may be further formed in a portion of a base structure 110 vertically overlapping the word line cut opening WLH, and the common source line may be electrically connected to the common source region CSR. The common source region CSR may be a region doped with a high concentration of impurities and may function as a source region supplying current to memory cells.

FIGS. 10A to 10H are cross-sectional views illustrating a method of manufacturing an integrated circuit device, according to some embodiments of the inventive concept.

For convenience of description, FIGS. 10A to 10H are provided as enlarged cross-sectional views mainly showing a portion MM of FIG. 4.

Figure 10A:
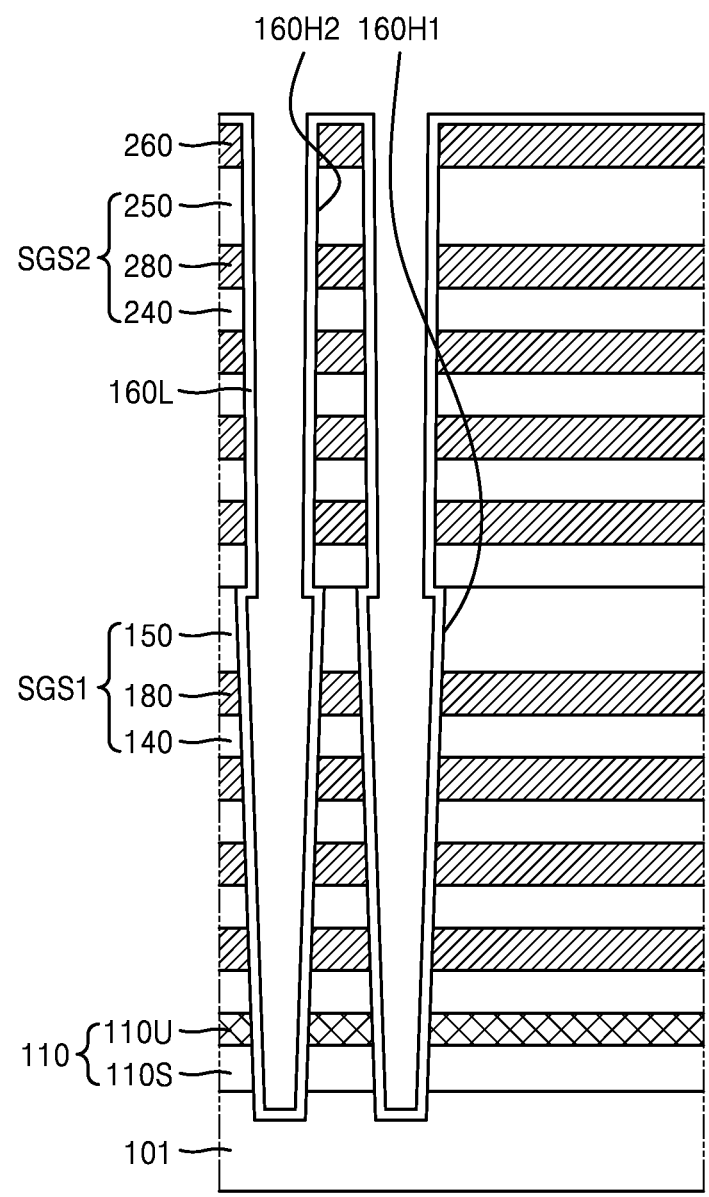
FIGS. 10A to 10H are cross-sectional views illustrating a method of manufacturing an integrated circuit device according to some embodiments of the inventive concept.

Referring to FIG. 10A, a base structure 110 including a lower sacrificial layer 110S and an upper base layer 110U may be formed on the semiconductor substrate 101.

Next, by alternately forming a plurality of first insulating layers 140 and a plurality of first mold layers 180 on the upper surface of the base structure 110 and forming a first upper insulating layer 150, a first sacrificial gate stack SGS1 may be formed. In addition, a first channel hole 160H1 passing through the first sacrificial gate stack SGS1 may be formed.

Next, by alternately forming a plurality of second insulating layers 240 and a plurality of second mold layers 280 on the first sacrificial gate stack SGS1 and forming a second upper insulating layer 250, a second sacrificial gate stack SGS2 may be formed. An upper sacrificial layer 260 may be formed on the top of the second sacrificial gate stack SGS2. In addition, a second channel hole 160H2 passing through the second sacrificial gate stack SGS2 may be formed.

Next, a sacrificial liner 160L may be formed to conformally cover the first channel hole 160H1 and the second channel hole 160H2. The sacrificial liner 160L may include an insulating material.

Figure 10B:
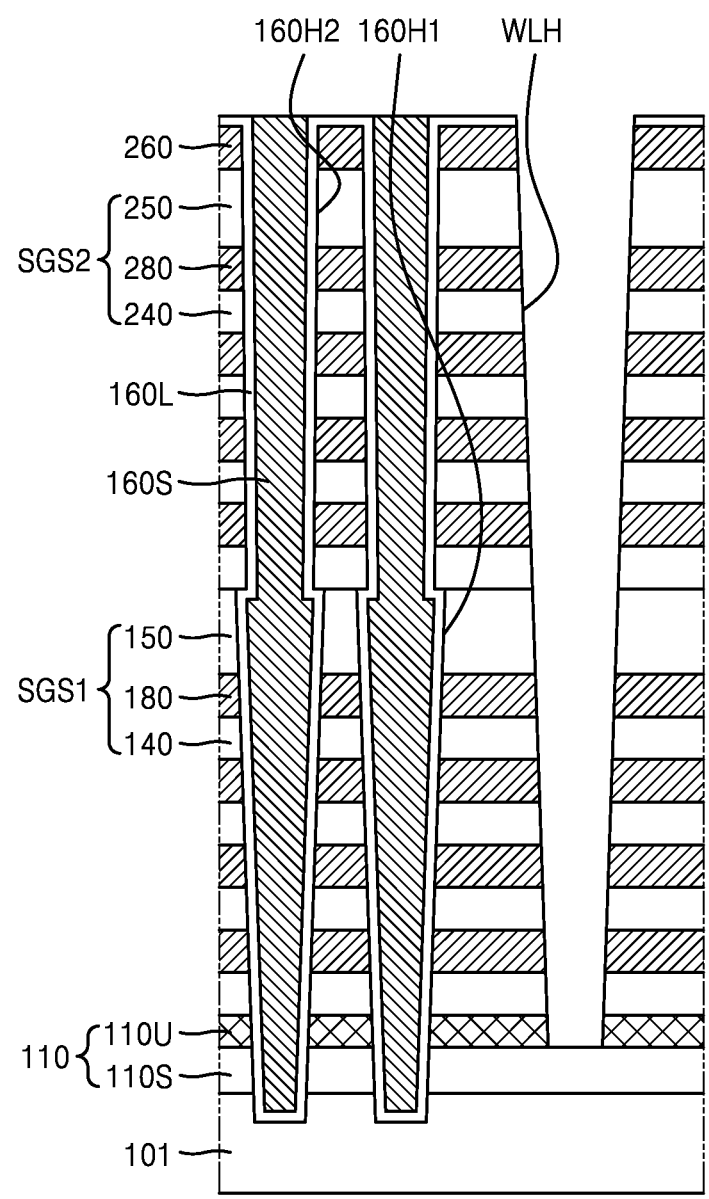

Referring to FIG. 10B, an insulating sacrificial layer 160S filling the first and second channel holes 160H1 and 160H2 may be formed.

The insulating sacrificial layer 160S may include an insulating material. For example, the insulating sacrificial layer 160S may include a silicon nitride layer. Accordingly, a phenomenon in which positive charges are accumulated around the first channel hole 160H1 and the second channel hole 160H2 may be reduced or eliminated.

Next, a word line cut opening WLH passing through the first and second sacrificial gate stacks SGS1 and SGS2 may be formed. The word line cut opening WLH may pass through the upper base layer 110U to expose the upper surface of the lower sacrificial layer 110S. Although not shown in the drawings, a blocking oxide layer may be formed on the side surface of the upper base layer 110U.

Figure 10C:
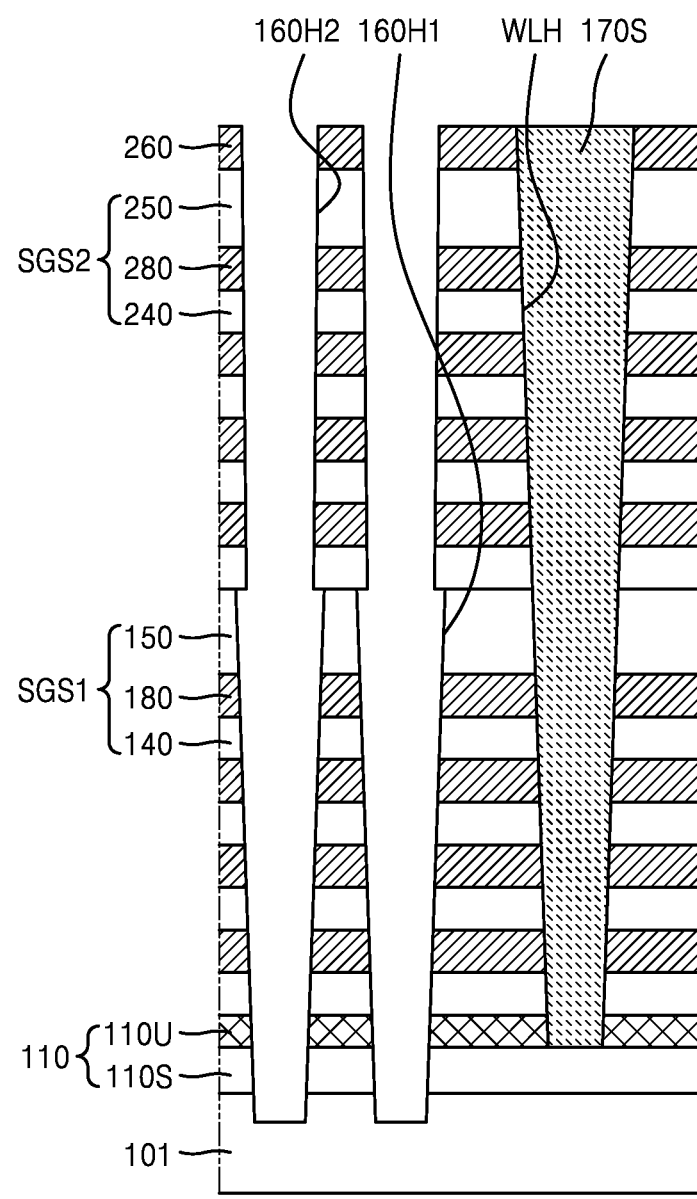

Referring to FIG. 10C, an internal sacrificial layer 170S filling the word line cut opening WLH may be formed.

The internal sacrificial layer 170S may include polysilicon that may not be doped with impurities. Although not shown in the drawings, a blocking oxide layer may be formed on the upper surface of the internal sacrificial layer 170S.

Next, both the insulating sacrificial layer 160S and the sacrificial liner 160L may be removed. Accordingly, the first channel hole 160H1 and the second channel hole 160H2 may be formed as empty spaces, and the empty spaces may expose the semiconductor substrate 101.

Figure 10D:
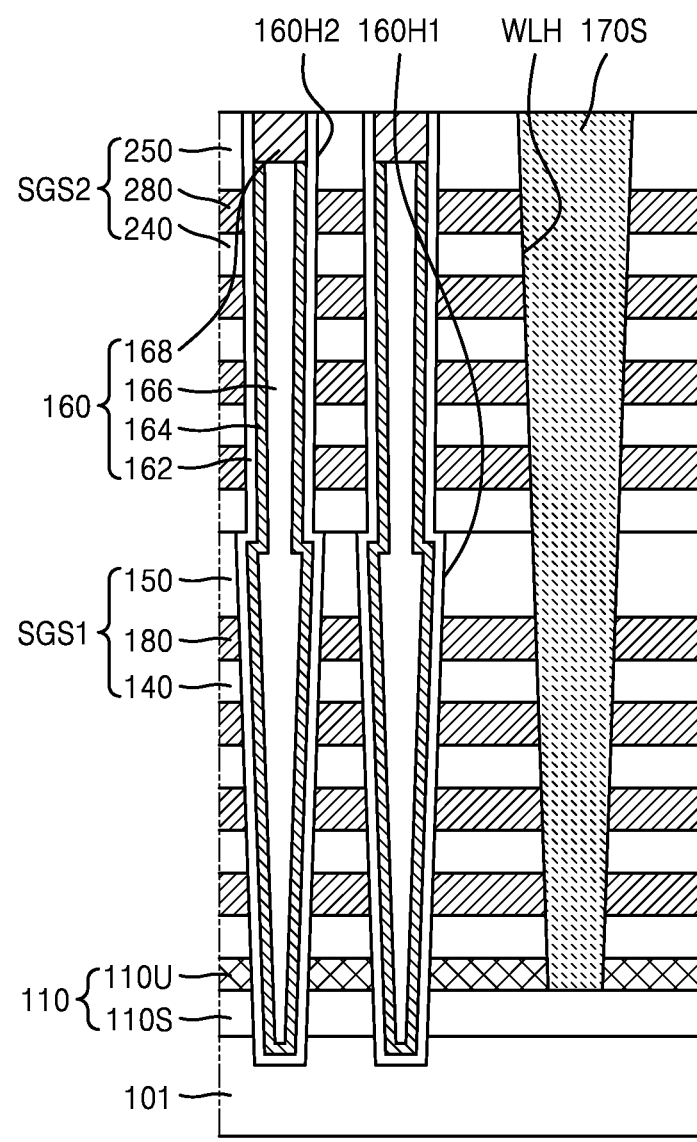

Referring to FIG. 10D, a channel structure 160 filling the first channel hole 160H1 and the second channel hole 160H2 may be formed.

The channel structure 160 may include a gate insulating layer 162, a channel layer 164, a buried insulating layer 166, and a conductive plug 168.

Next, the upper sacrificial layer 260 (see FIG. 10C) may be completely removed such that the upper surface of the conductive plug 168 and the upper surface of the internal sacrificial layer 170S are exposed. The upper sacrificial layer 260 (see FIG. 10C) may be removed by a planarization process such as chemical mechanical polishing (CMP) or etch-back.

Figure 10E:
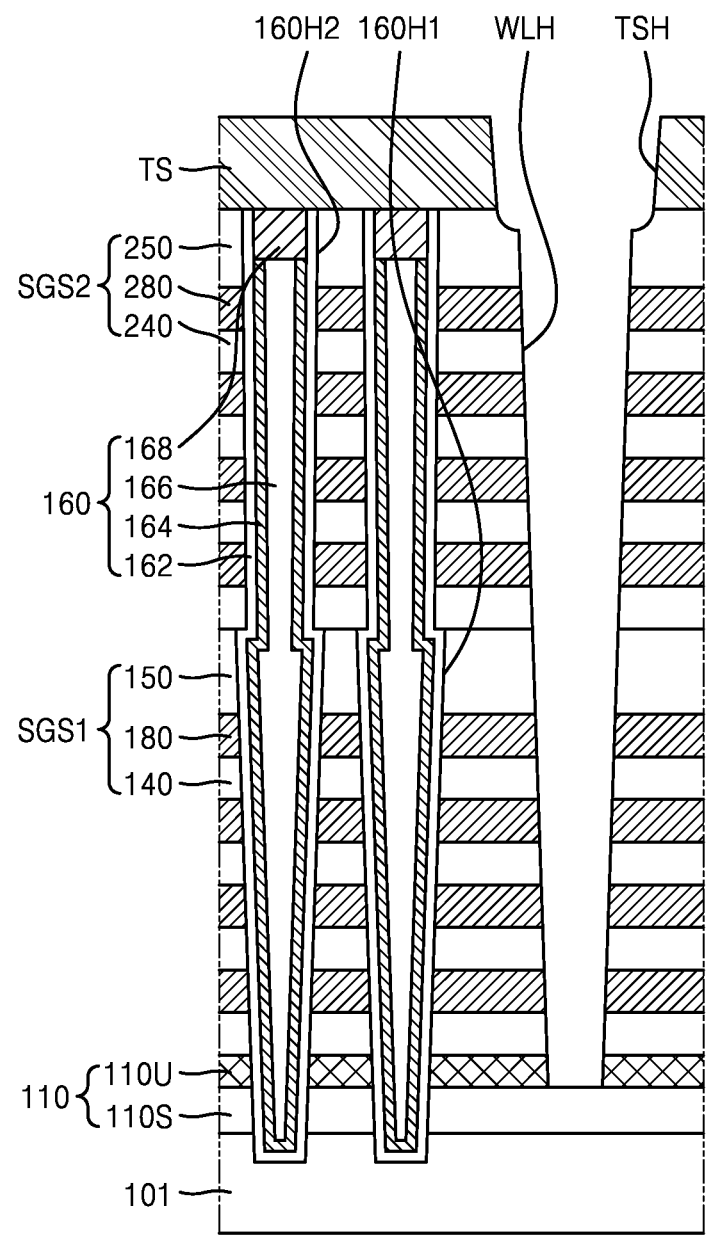

Referring to FIG. 10E, an upper support layer TS may be formed to cover the upper surface of the conductive plug 168 and the upper surface of the internal sacrificial layer 170S (see FIG. 10D).

Next, a hole portion TSH may be formed in the upper support layer TS and accordingly, the internal sacrificial layer 170S (see FIG. 10D) may be exposed. The hole portion TSH may be formed by an etching process, and in this case, over-etching may occur in the etching process and thus, a portion of the second upper insulating layer 250 may also be etched.

Figure 10F:
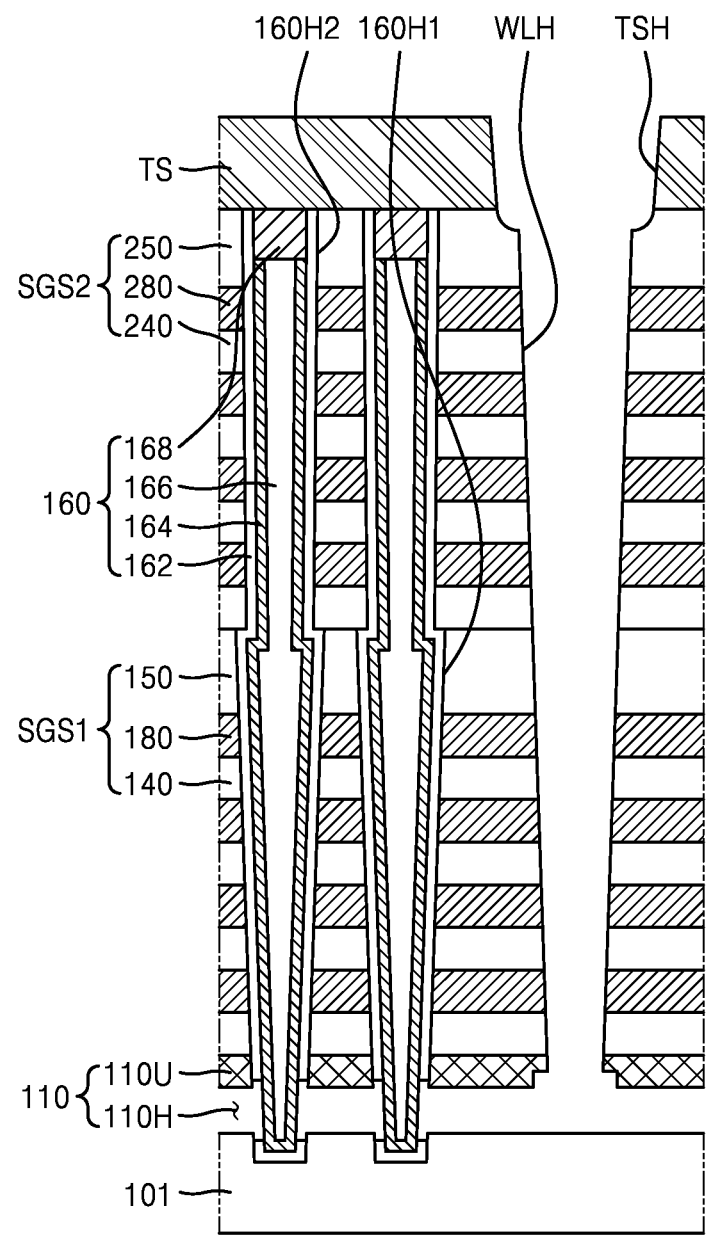

Referring to FIG. 10F, the entire lower sacrificial layer 110S (see FIG. 10E) and a portion of the upper base layer 110U may be etched.

The entire lower sacrificial layer 110S (see FIG. 10E) may be etched to form a horizontal hole portion 110H, and in addition, a portion of the gate insulating layer 162 may be etched. Accordingly, a portion of the channel layer 164 may be exposed by the horizontal hole portion 110H.

Figure 10G:
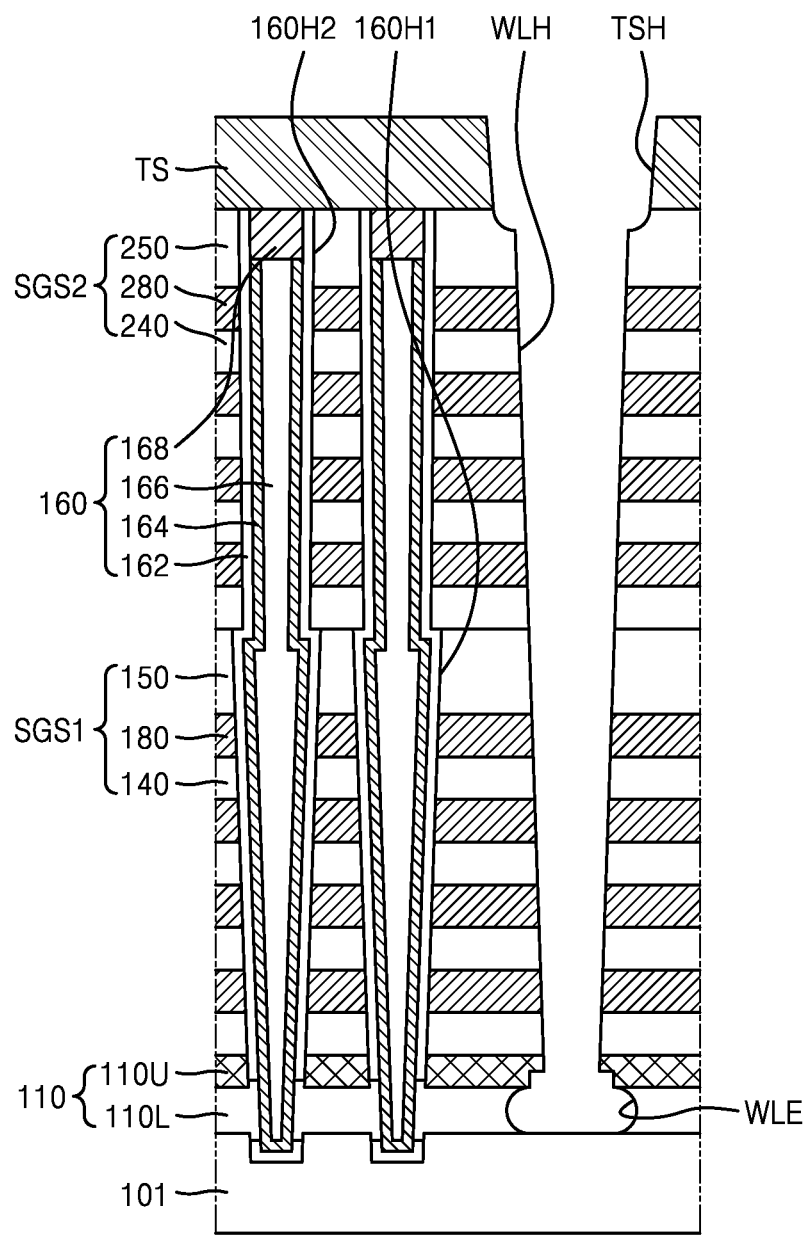

Referring to FIG. 10G, a lower base layer 110L may be formed in the horizontal hole portion 110H (see FIG. 10E).

The lower base layer 110L may include, for example, polysilicon doped with impurities. The lower base layer 110L may be formed to contact an exposed portion of the channel layer 164 and may be formed such that an expansion portion WLE having a step shape is arranged in a lower portion of the word line cut opening WLH.

Figure 10H:
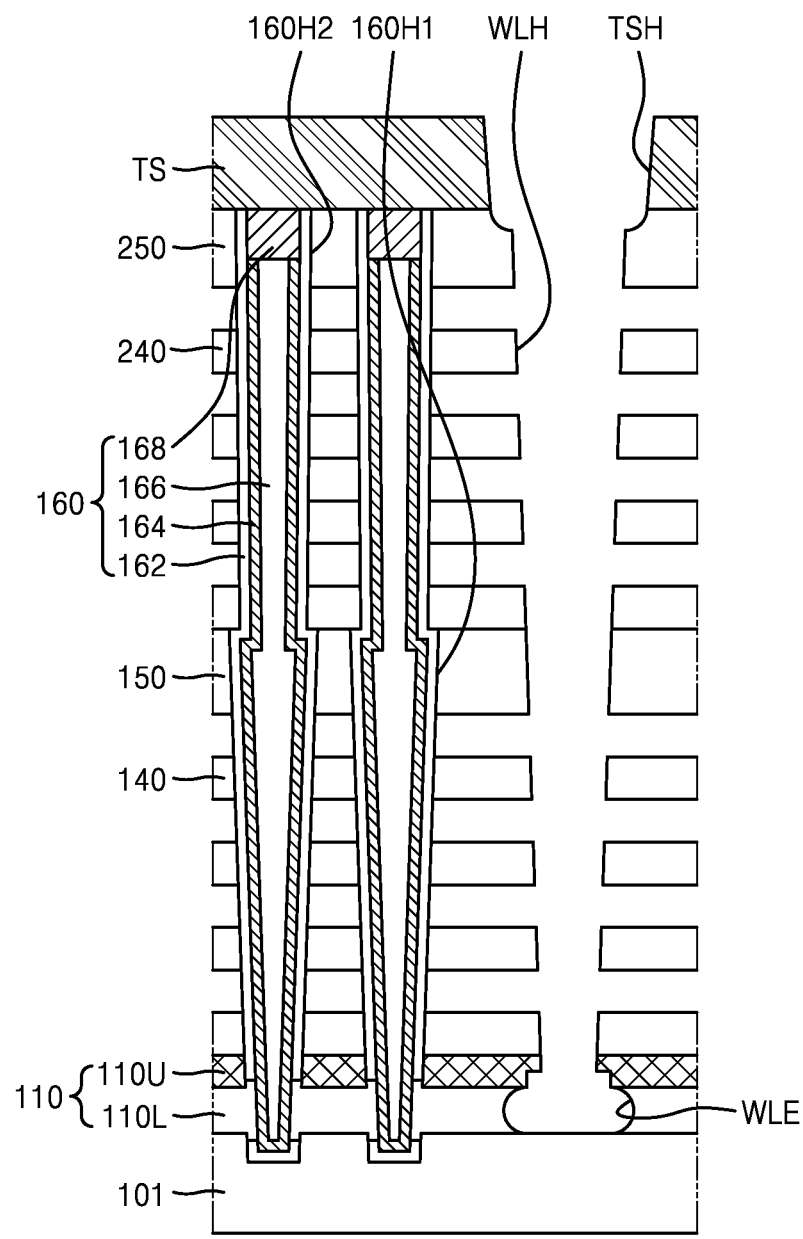

Referring to FIG. 10H, the plurality of first and second mold layers 180 and 280 exposed to sidewalls of the word line cut opening WLH may be removed.

A process of removing the plurality of first and second mold layers 180 and 280 may be, for example, a wet etching process using a phosphoric acid solution as an etching solution.

Referring back to FIG. 4, a plurality of first and second gate electrodes 130 and 230 may be formed in a space from which the plurality of first and second mold layers 180 and 280 are removed, and the integrated circuit device 100 may be completed by performing subsequent processes.

According to some embodiments of the inventive concept, the insulating sacrificial layer 160S (see FIG. 10C) is first filled in the channel hole 160H instead of a conductive material layer in a vertical memory device, and then the word line cut opening WLH is etched. Therefore, the occurrence of defects due to tilting of plasma ions during the etching process may be reduced or prevented, and thus, excellent electrical characteristics may be provided.

Figure 11:
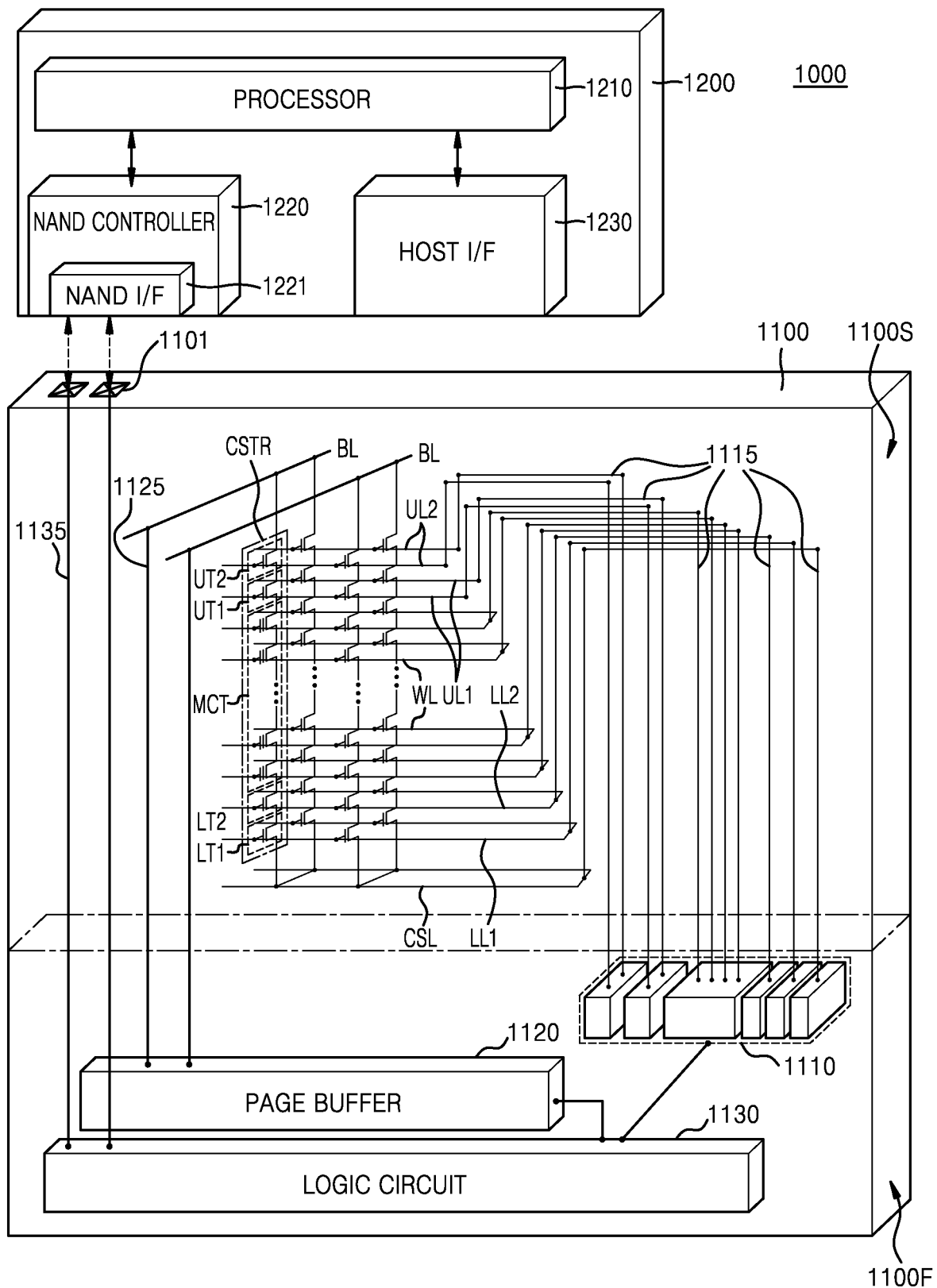
FIG. 11 is a diagram illustrating an electronic system including an integrated circuit device according to some embodiments of the inventive concept.

FIG. 11 is a diagram illustrating an electronic system 1000 including an integrated circuit device, according to some embodiments of the inventive concept.

Referring to FIG. 11, the electronic system 1000 may include an integrated circuit device 1100 and a controller 1200 electrically connected to the integrated circuit device 1100.

The electronic system 1000 may include a storage device, including one or a plurality of integrated circuit devices 1100, or an electronic device including a storage device. For example, the electronic system 1000 may include a solid state drive (SSD) device, a universal serial bus (USB), a computing system, a medical device, and/or a communication device, which includes at least one integrated circuit device 1100.

The integrated circuit device 1100 may include a nonvolatile vertical memory device. For example, the integrated circuit device 1100 may include a NAND flash memory device including at least one of the integrated circuit devices 100, 200, and 300 described above with reference to FIGS.

1 to 9. The integrated circuit device 1100 may include a first structure 1100F and a second structure 1100S on the first structure 1100F. In some embodiments, the first structure 1100F may be arranged at one side of the second structure 1100S. The first structure 1100F may include a peripheral circuit structure that includes a decoder circuit 1110, a page buffer 1120, and a logic circuit 1130. The second structure 1100S may include a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include a plurality of lower transistors LT1 and LT2 adjacent to the common source line CSL, a plurality of upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be variously changed.

In some embodiments, the upper transistors UT1 and UT2 may include a string selection transistor, and the lower transistors LT1 and LT2 may include a ground selection transistor. The first and second gate lower lines LL1 and LL2 may respectively be gate electrodes of the lower transistors LT1 and LT2. The word line WL may be a gate electrode of the memory cell transistor MCT, and the gate upper lines UL1 and UL2 may respectively be gate electrodes of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connection wirings 1115 that extend up to the second structure 1100S from an inner portion of the first structure 1100F. The plurality of bit lines BL may be electrically connected to the page buffer 1120 through a plurality of second connection wirings 1125 that extend up to the second structure 1100S from the inner portion of the first structure 1100F.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130.

The integrated circuit device 1100 may communicate with the controller 1200 through an input/output (I/O) pad 1101 electrically connected to the logic circuit 1130. The I/O pad 1101 may be electrically connected to the logic circuit 1130 through an I/O connection wiring 1135 that extends up to the second structure 1100S from the inner portion of the first structure 1100F.

The controller 1200 may include a processor 1210, a NAND controller 1220, and a host interface 1230. In some embodiments, the electronic system 1000 may include a plurality of integrated circuit devices 1100, and in this case, the controller 1200 may control the plurality of integrated circuit devices 1100.

The processor 1210 may control an overall operation of the electronic system 1000 including the controller 1200. The processor 1210 may operate based on firmware and may control the NAND controller 1220 to access the integrated circuit device 1100. The NAND controller 1220 may include a NAND interface 1221, which processes communication with the integrated circuit device 1100. A control command for controlling the integrated circuit device 1100, data which is to be written in the plurality of memory cell transistors MCT of the integrated circuit device 1100, and data which is to be read from the plurality of memory cell transistors MCT of the integrated circuit device 1100 may be transferred through the NAND interface 1221. The host interface 1230 may provide a communication function between the electronic system 1000 and an external host. When a control command is received from the external host through the host interface 1230, the processor 1210 may control the integrated circuit device 1100 in response to the control command.

Figure 12:
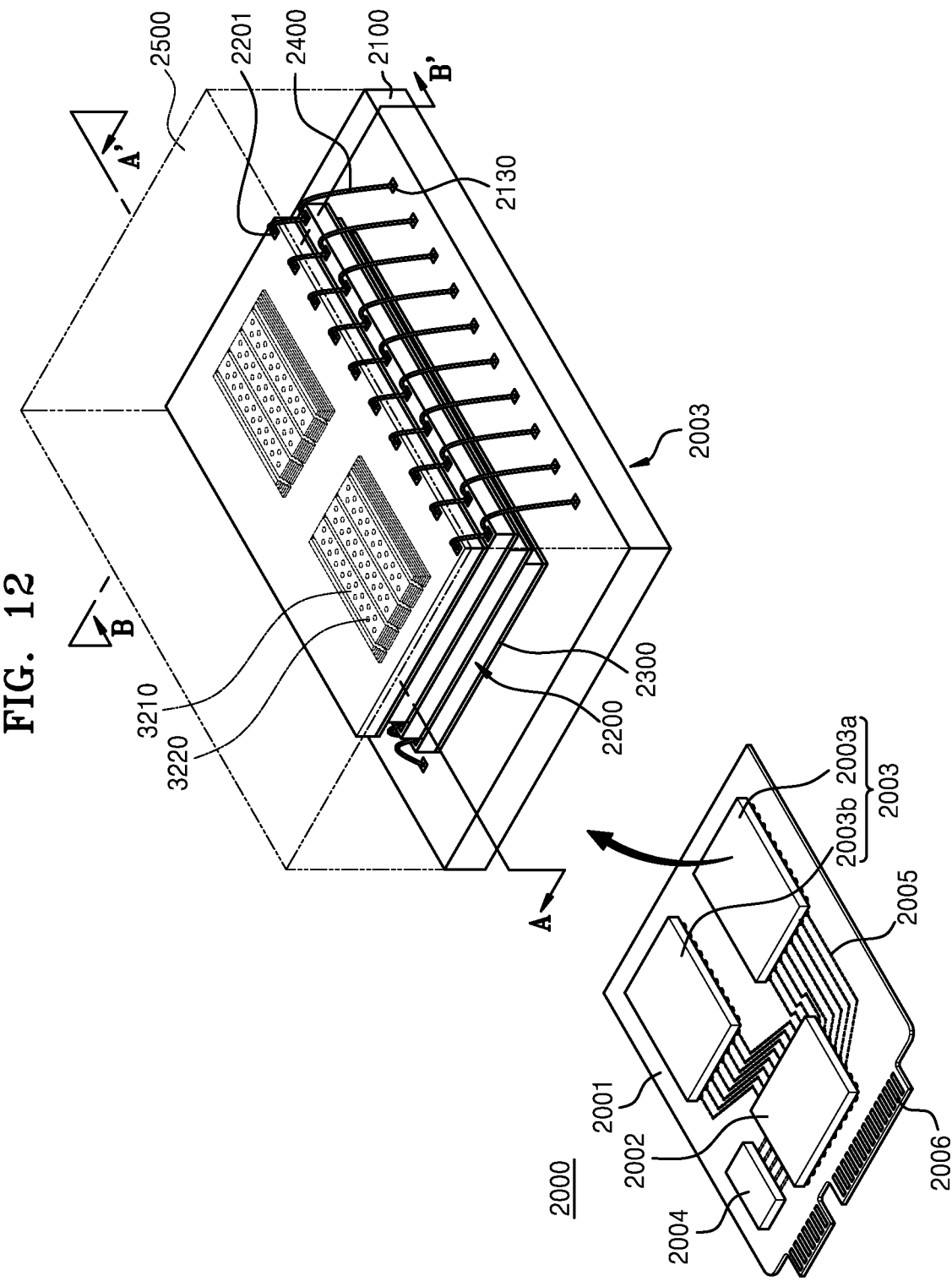
FIG. 12 is a perspective view illustrating an electronic system including an integrated circuit device according to some embodiments of the inventive concept.

FIG. 12 is a perspective view illustrating an electronic system 2000 including an integrated circuit device, according to some embodiments of the inventive concept.

Referring to FIG. 12, the electronic system 2000 may include a main board 2001, a controller 2002 mounted on the main board 2001, one or more semiconductor packages 2003, and DRAM 2004. The semiconductor package 2003 and the DRAM 2004 may be connected to the controller 2002 by a plurality of wiring patterns 2005 provided on the main board 2001.

The main board 2001 may include a connector 2006 including a plurality of pins that are configured to be coupled to the external host. The number and arrangement of pins in the connector 2006 may be changed based on a communication interface between the electronic system 2000 and the external host. In some embodiments, the electronic system 2000 may communicate with the external host on the basis of one of interfaces such as USB, peripheral component interconnect express (PCI-Express), serial advanced technology attachment (SATA), and M-Phy for universal flash storage (UFS). In some embodiments, the electronic system 2000 may operate based on power supplied from the external host through the connector 2006. The electronic system 2000 may further include a power management integrated circuit (PMIC) that distributes the power, supplied from the external host, to the controller 2002 and the semiconductor package 2003.

The controller 2002 may write data in the semiconductor package 2003 or may read data from the semiconductor package 2003 and may improve an operation speed of the electronic system 2000.

The DRAM 2004 may include a buffer memory for reducing a speed difference between the external host and the semiconductor package 2003, which is a data storage space. The DRAM 2004 included in the electronic system 2000 may operate as a cache memory and may provide a space for arbitrarily storing data in a control operation performed on the semiconductor package 2003. When the DRAM 2004 is included in the electronic system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 arranged on a bottom surface of each of the plurality of semiconductor chips 2200, a connection structure 2400 electrically connecting the plurality of semiconductor chips 2200 to the package substrate 2100, and a molding layer 2500 which covers the plurality of semiconductor chips 2200 and the connection structure 2400 on the package substrate 2100.

The package substrate 2100 may include a printed circuit board (PCB) including a plurality of package upper pads 2130. Each of the plurality of semiconductor chips 2200 may include an I/O pad 2201. The I/O pad 2201 may correspond to the I/O pad 1101 of FIG. 11. Each of the plurality of semiconductor chips 2200 may include a plurality of gate stacks 3210 and a plurality of channel structures 3220. Each of the plurality of semiconductor chips 2200 may include at least one the integrated circuit devices 100, 200, and 300 described above with reference to FIGS. 1 to 9.

In some embodiments, the connection structure 2400 may include a bonding wire that electrically connects the I/O pad 2201 to the package upper pad 2130. Therefore, in the first and second semiconductor packages 2003a and 2003b, the plurality of semiconductor chips 2200 may be electrically connected to one another on the basis of a bonding wire manner and may be electrically connected to the package upper pad 2130 of the package substrate 2100. In some embodiments, in the first and second semiconductor packages 2003a and 2003b, the plurality of semiconductor chips 2200 may be electrically connected to one another by a connection structure including a through silicon via (TSV) instead of the connection structure 2400 based on the bonding wire manner.

In some embodiments, the controller 2002 and the plurality of semiconductor chips 2200 may be included in one package. In some embodiments, the controller 2002 and the plurality of semiconductor chips 2200 may be mounted on a separate interposer substrate that differs from the main board 2001, and the controller 2002 and the plurality of semiconductor chips 2200 may be electrically connected to one another by a wiring formed on the interposer substrate.

Figure 13:
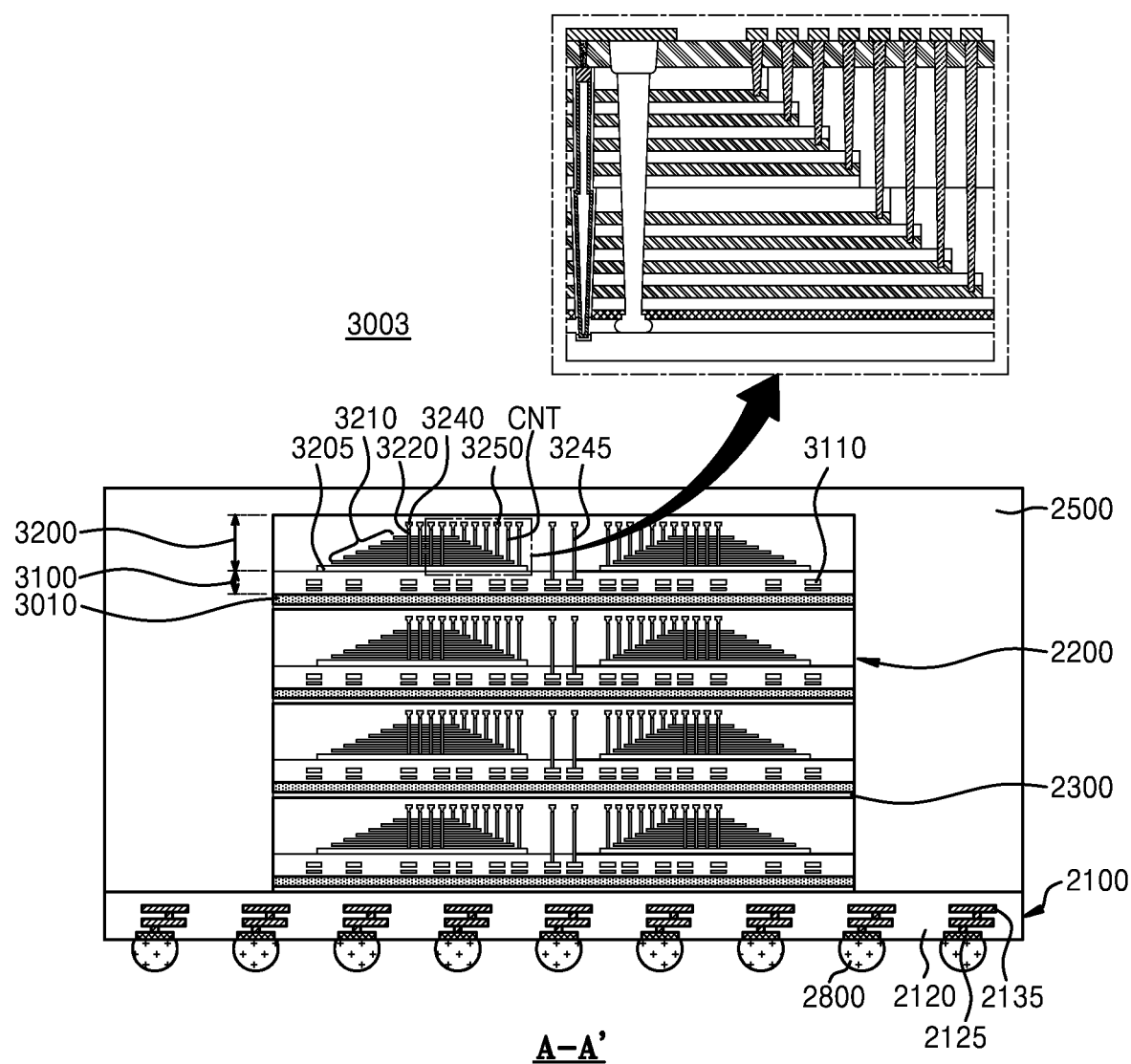
FIGS. 13 to 15 are cross-sectional views respectively illustrating semiconductor packages each including an integrated circuit device according to some embodiments of the inventive concept.
Figure 14:
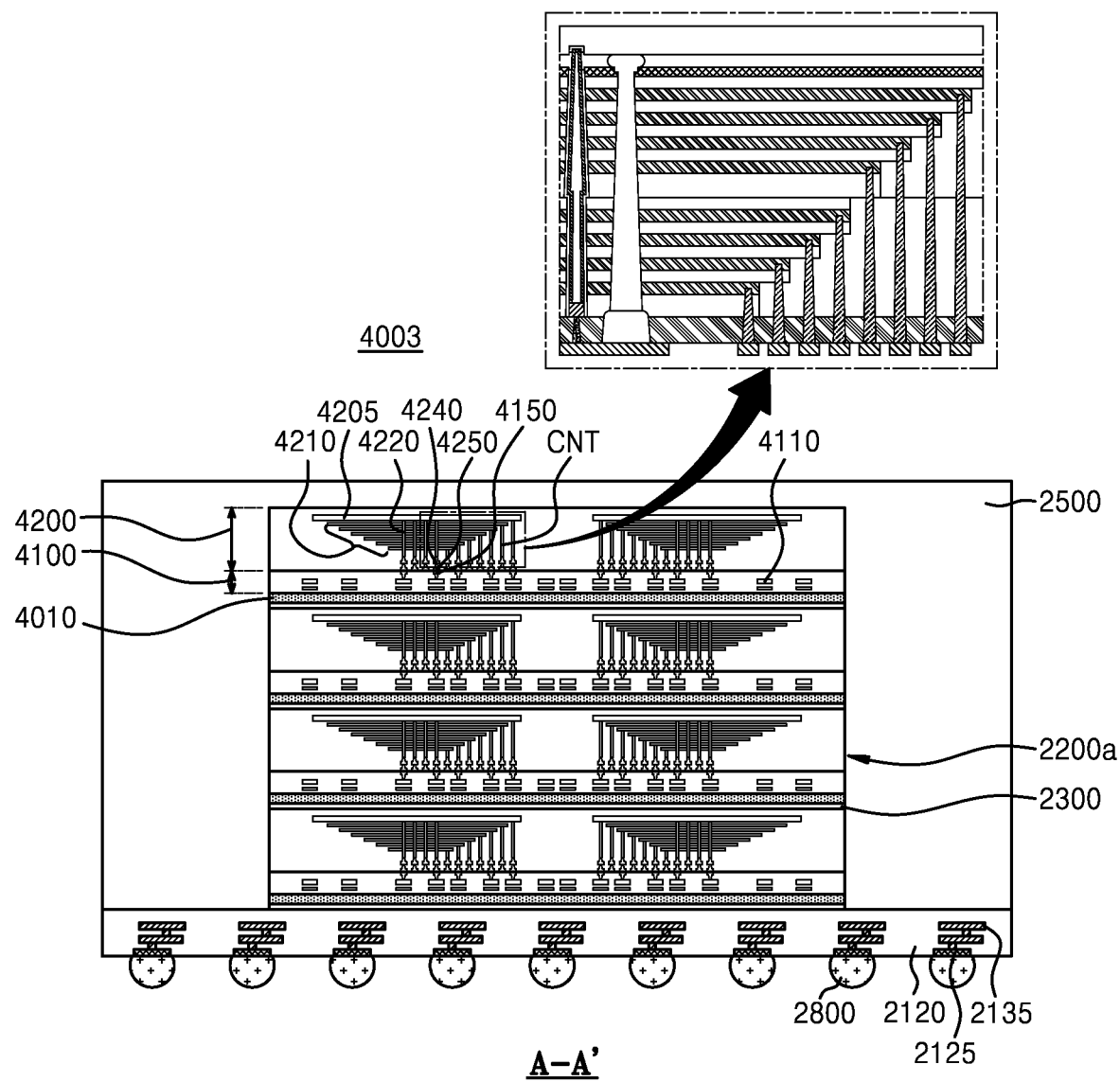
Figure 15:
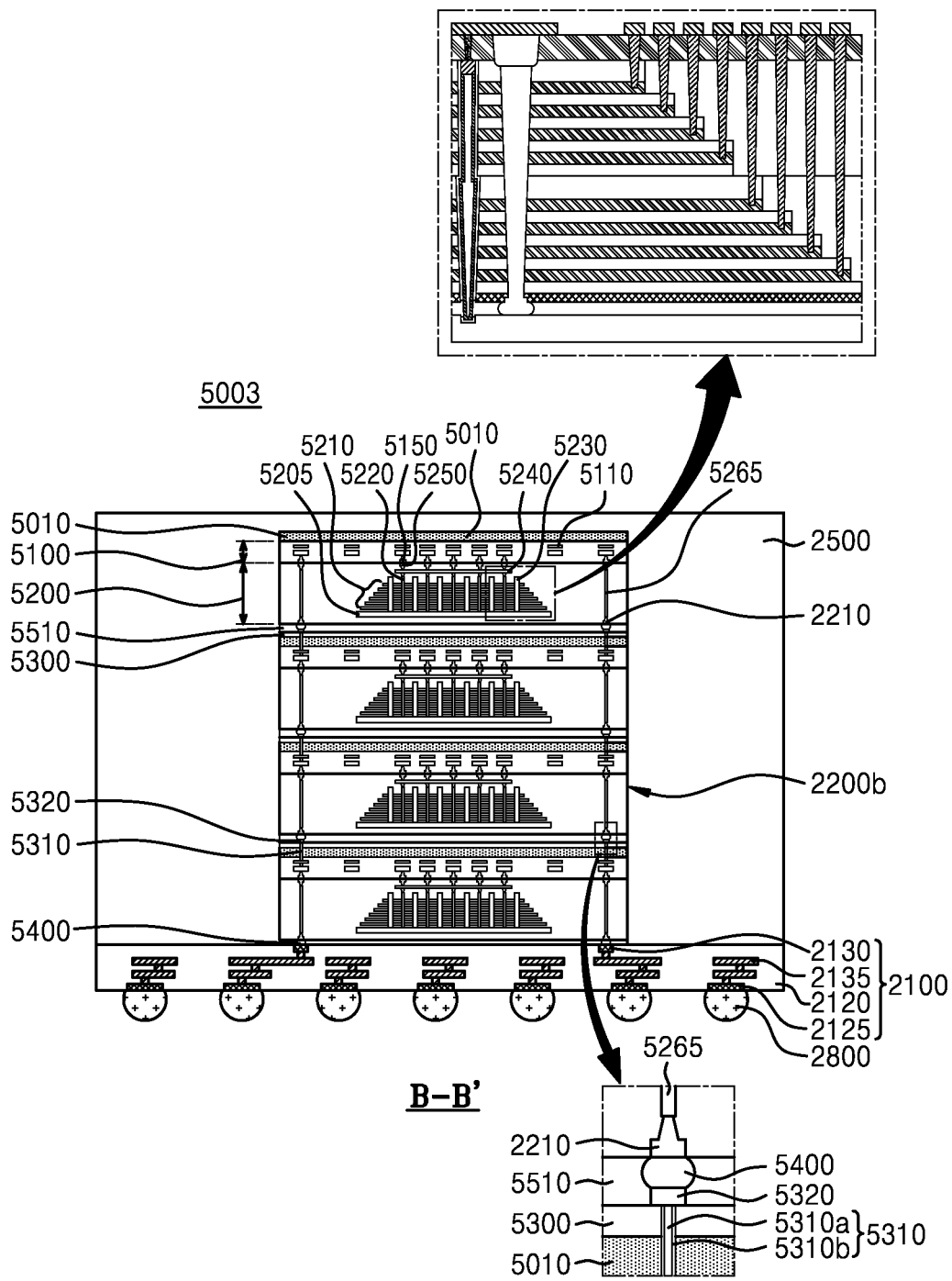

FIGS. 13 to 15 are cross-sectional views illustrating semiconductor packages 3003, 4003, and 5003 each including an integrated circuit device according to some embodiments of the inventive concept.

In detail, in FIGS. 13 and 14, a configuration based on a cross-section taken along line A-A' of FIG. 12 is illustrated, and in FIG. 15, a configuration based on a cross-section taken along line B-B' of FIG. 12 is illustrated Referring to FIG. 13, in the semiconductor package 3003, a package substrate 2100 may include a PCB.

The package substrate 2100 may include a package substrate body portion 2120, a plurality of package upper pads 2130 (see FIG. 12) arranged on the upper surface of the package substrate body portion 2120, a plurality of lower pads 2125 which are arranged on or exposed through the bottom surface of the package substrate body portion 2120, and a plurality of internal wirings 2135 which electrically connect a plurality of upper pads 2130 to the plurality of lower pads 2125 in the package substrate body portion 2120. The plurality of upper pads 2130 may be electrically connected to a plurality of connection structures 2400 (see FIG. 12). The plurality of lower pads 2125 may be connected to, through a plurality of conductive connection parts 2800, the plurality of wiring patterns 2005 on the main board 2001 of the electronic system 2000 illustrated in FIG. 12.

Each of the plurality of semiconductor chips 2200 may include a semiconductor substrate 3010, and a first structure 3100 and a second structure 3200, which are sequentially stacked on the semiconductor substrate 3010. The first structure 3100 may include a peripheral circuit region including a plurality of peripheral wirings 3110. The first structure 3100 may include a peripheral circuit transistor 60TR, as described above with reference to FIG. 8. In FIG. 13, it is illustrated that the first structure 3100 has a structure such as a peripheral circuit region of the integrated circuit device 200 illustrated in FIG. 8, but the inventive concept is not limited thereto.

The second structure 3200 may include a common source line 3205, a gate stack 3210 on the common source line 3205, a channel structure 3220 passing through the gate stack 3210, and a bit line 3240 electrically connected to the channel structure 3220. The gate stack 3210 may include first and second gate stack GS1 and GS2 illustrated in FIG. 8. The first and second gate stacks GS1 and GS2 may include a plurality of gate electrodes 130. Also, each of the plurality of semiconductor chips 2200 may include a plurality of contact structures CNT electrically connected to a gate electrode 130.

Each of the plurality of semiconductor chips 2200 may include a through wiring 3245 that is electrically connected to a plurality of peripheral wirings 3110 of the first structure 3100 and extends to an inner portion of the second structure 3200. The through wiring 3245 may be arranged outside the gate stack 3210. In some embodiments, the semiconductor package 3003 may further include a through wiring that passes through the gate stack 3210. Each of the plurality of semiconductor chips 2200 may further include an I/O pad 2201 (see FIG. 12) electrically connected to the plurality of peripheral wirings 3110 of the first structure 3100.

Referring to FIG. 14, the semiconductor package 4003 has a configuration similar to that of the semiconductor package 3003 described with reference to FIG. 13. However, the semiconductor package 4003 includes a plurality of semiconductor chips 2200a.

Each of the plurality of semiconductor chips 2200a may include a semiconductor substrate 4010, a first structure 4100 on the semiconductor substrate 4010, and a second structure 4200 on the first structure 4100, the second structure 4200 being bonded to the first structure 4100 by a wafer bonding method.

The first structure 4100 may include a peripheral circuit region including a peripheral wiring 4110 and a plurality of first bonding structures 4150. As described with reference to FIG. 8, the first structure 4100 may include a peripheral circuit transistor 60TR. In FIG. 14, it is illustrated that the first structure 4100 has the same structure as a peripheral circuit region of the integrated circuit device 200 illustrated in FIG. 8, but the inventive concept is not limited thereto.

The second structure 4200 may include a common source line 4205, a gate stack 4210 between the common source line 4205 and the first structure 4100, and a channel structure 4220 passing through the gate stack 4210. The gate stack 4210 may include first and second gate stacks GS1 and GS2 illustrated in FIG. 8. The first and second gate stacks GS1 and GS2 may include a plurality of gate electrodes 130. In addition, each of the plurality of semiconductor chips 2200a may include a plurality of contact structures CNT electrically connected to a gate electrode 130.

In addition, each of the plurality of semiconductor chips 2200a may include a plurality of second bonding structures 4250 electrically connected to the plurality of gate electrodes 130 of the gate stack 4210, respectively. For example, some of the plurality of second bonding structures 4250 may be configured to be connected to a bit line 4240 electrically connected to the channel structure 4220. The others of the plurality of second bonding structures 4250 may be configured to be electrically connected to a gate electrode 130 through a plurality of contact structures CNT.

The plurality of first bonding structures 4150 of the first structure 4100 and the plurality of second bonding structures 4250 of the second structure 4200 may be bonded to each other while contacting each other. Bonding portions of the plurality of first bonding structures 4150 and the plurality of second bonding structures 4250 may include metal, for example, copper (Cu), but the inventive concept is not limited thereto.

In some embodiments, a connection between each of the plurality of semiconductor chips 2200 illustrated in FIG. 13 and a connection between each of the plurality of semiconductor chips 2200a illustrated in FIG. 14 may be made through a plurality of connection structures 2400 (see FIG. 12) in the form of bonding wires. In some embodiments, an electrical connection between each of the plurality of semiconductor chips 2200 illustrated in FIG. 13 and an electrical connection between each of the plurality of semiconductor chips 2200a illustrated in FIG. 14 may be made by a connection structure including a through electrode TSV.

Referring to FIG. 15, in the semiconductor package 5003, a plurality of semiconductor chips 2200b may be vertically aligned with each other.

Each of the plurality of semiconductor chips 2200b may include a semiconductor substrate 5010, a first structure 5100 formed under the semiconductor substrate 5010, and a second structure 5200 formed under the first structure 5100 and bonded to the first structure 5100 by a wafer bonding method.

The first structure 5100 may include a peripheral circuit region including peripheral wirings 5110 and a first bonding structure 5150. As described with reference to FIG. 8, the first structure 5100 may include a peripheral circuit transistor 60TR. In FIG. 15, it is illustrated that the first structure 5100 has the same structure as a peripheral circuit region of the integrated circuit device 200 illustrated in FIG. 8, but the inventive concept is not limited thereto.

The second structure 5200 may include a common source line 5205, a gate stack 5210 between the common source line 5205 and the first structure 5100, channel structures 5220 and a word line cut 5230, which pass through the gate stack 5210, a plurality of second bonding structures 5250 electrically connected to the channel structures 5220 and a plurality of gate electrodes 130 of the gate stack 5210, respectively. For example, some of the plurality of second bonding structures 5250 may be configured to be connected to a bit line 5240 electrically connected to the channel structures 5220. The others of the plurality of second bonding structures 5250 may be configured to be electrically connected to a gate electrode 130 through a plurality of contact structures CNT.

The plurality of first bonding structures 5150 of the first structure 5100 and the plurality of second bonding structures 5250 of the second structure 5200 may be bonded to each other while contacting each other. Bonding portions of the plurality of first bonding structures 5150 and the plurality of second bonding structures 5250 may include metal, for example, copper (Cu), but the inventive concept is not limited thereto.

Among the plurality of semiconductor chips 2200b, the remaining semiconductor chips except for the uppermost semiconductor chip may each further include a rear insulating layer 5300 on the semiconductor substrate 5010, rear I/O pads 5320 on the rear insulating layer 5300, and through electrode structures 5310 passing through the semiconductor substrate 5010 and the rear insulating layer 5300 and electrically connecting the peripheral wirings 5110 of the first structure 5100 to the rear I/O pads 5320.

Each of the through electrode structures 5310 may include a through electrode 5310a and an insulating spacer 5310b surrounding a side surface of the through electrode 5310a. The semiconductor package 5003 may further include connection structures 5400 arranged under each of the plurality of semiconductor chips 2200b, for example, a conductive bump. The connection structures 5400 may electrically connect the plurality of semiconductor chips 2200b and may electrically connect the plurality of semiconductor chips 2200b to the package substrate 2100. An underfill material layer 5510 may surround side surfaces of the connection structures 5400. In addition, the semiconductor package 5003 may further include a through structure 5265, which passes through the second structure 5200 and is electrically connected to the connection structures 5400, and a through pad 2210.

While the inventive concept has been particularly shown and described with reference to some example embodiments thereof, it will be understood that various changes in form and details may be made therein without departing from the scope of the following claims. The above-disclosed subject matter is to be considered illustrative, and not restrictive, and the appended claims are intended to cover all such modifications, enhancements, and other embodiments, which fall within the scope of the inventive concept.

What is claimed is:

1. An integrated circuit device comprising:
a substrate;
a lower base layer and an upper base layer sequentially stacked on the substrate;
a first gate stack extending on the upper base layer in a first direction that is parallel to a main surface of the substrate, the first gate stack including a plurality of first gate electrodes and a plurality of first insulating layers alternately stacked in a second direction that is perpendicular to the main surface of the substrate;
a second gate stack extending on the first gate stack in the first direction and including a plurality of second gate electrodes and a plurality of second insulating layers alternately stacked in the second direction;
a channel structure extending through the first gate stack and the second gate stack in the second direction;
a word line cut opening extending through the first gate stack and the second gate stack in the second direction and extending in the first direction;
an upper support layer on the second gate stack and comprising a plurality of holes, each of which overlaps the word line cut opening in the second direction and comprises a portion that overlaps the second gate stack in the second direction and in a third direction that is parallel to the main surface of the substrate and is perpendicular to the first direction; and
an insulating structure in the word line cut opening and the plurality of holes,
wherein an upper surface of the channel structure is in contact with a lower surface of the upper support layer,
wherein an upper surface of an uppermost one of the plurality of second insulating layers is higher than respective lowermost ends of the plurality of holes, and
wherein the upper surface of the channel structure is higher than the respective lowermost ends of the plurality of holes.

2. The integrated circuit device of claim 1, wherein the channel structure includes:
a buried insulating layer;
a channel layer and a gate insulating layer sequentially stacked on a sidewall of the buried insulating layer; and a conductive plug on the buried insulating layer,
wherein an upper surface of the conductive plug is in contact with the lower surface of the upper support layer.

3. The integrated circuit device of claim 2, wherein the insulating structure includes:
a first insulating structure in the word line cut opening; and
second insulating structures in the plurality of holes, respectively,
wherein each of the second insulating structures comprises a lower surface that contacts an upper surface of the first insulating structure and protrudes outwardly beyond the upper surface of the first insulating structure, and
wherein the lower surfaces of the second insulating structures are lower than the upper surface of the conductive plug relative to the substrate.

4. The integrated circuit device of claim 2, wherein the insulating structure includes:
an insulating spacer extending on sidewalls and bottom surfaces of the word line cut opening and the plurality of holes and defining a space; and
an insulating buried layer in the space.

5. The integrated circuit device of claim 1, wherein the word line cut opening comprises first portions overlapped by the plurality of holes and second portions covered by the upper support layer, and
the plurality of holes are spaced apart from each other by a uniform distance in the first direction along the word line cut opening.

6. The integrated circuit device of claim 5, wherein respective narrowest widths of the plurality of holes in the third direction are greater than a widest width of the word line cut opening in the third direction.

7. The integrated circuit device of claim 2, wherein the channel structure extends through the upper base layer and the lower base layer and contacts the substrate, and
the channel layer contacts the lower base layer.

8. The integrated circuit device of claim 7, wherein the lower base layer includes a protrusion contacting the channel layer, and
wherein an upper surface of the protrusion is higher than an upper surface of the lower base layer relative to the substrate, and a lower surface of the protrusion is lower than a lower surface of the lower base layer relative to the substrate.

9. The integrated circuit device of claim 1, wherein the word line cut opening extends through the upper base layer and the lower base layer,
the word line cut opening includes a lower expansion portion and an upper expansion portion, the lower expansion portion protrudes laterally into the lower base layer, and the upper expansion portion protrudes laterally into the upper base layer,
wherein a widest width of the lower expansion portion in the third direction is greater than a widest width of the upper expansion portion in the third direction, and
wherein the widest width of the upper expansion portion is greater than a width in the third direction of a portion of the word line cut opening that extends through an upper portion of the upper base layer.

10. The integrated circuit device of claim 9, wherein a height of the lower expansion portion in the second direction is greater than a height of the upper expansion portion in the second direction.

11. An integrated circuit device comprising:
a gate stack extending on a substrate in a first direction that is parallel to a main surface of the substrate and including a plurality of gate electrodes overlapping each other in a vertical direction that is perpendicular to the main surface of the substrate;
a channel structure extending through the gate stack in the vertical direction;
a word line cut opening extending through the gate stack in the vertical direction and extending in the first direction; and
an upper support layer on the gate stack and comprising a hole overlapping the word line cut opening in the vertical direction,
wherein an upper surface of the channel structure is in contact with a lower surface of the upper support layer, and
wherein the upper support layer is thicker in the vertical direction, from the lower surface thereof to an upper surface thereof, than an uppermost one of the gate electrodes.

12. The integrated circuit device of claim 11, wherein the channel structure includes:
a buried insulating layer;
a channel layer and a gate insulating layer sequentially arranged on a sidewall of the buried insulating layer; and
a conductive plug on the buried insulating layer,
wherein an upper surface of the conductive plug is in contact with the lower surface of the upper support layer.

13. The integrated circuit device of claim 12, wherein the hole protrudes into the gate stack, and
wherein the hole includes a plurality of holes arranged in the first direction along the word line cut opening, respective narrowest widths of the plurality of holes in a second direction are greater than a widest width of the word line cut opening in the second direction, and the second direction is parallel to the main surface of the substrate and is perpendicular to the first direction.

14. The integrated circuit device of claim 12, wherein a portion of the hole is in the gate stack and defines a recess in an upper surface of the gate stack, and the recess of the gate stack is recessed toward the substrate beyond the upper surface of the conductive plug.

15. The integrated circuit device of claim 14, further comprising an insulating structure,
wherein the insulating structure includes:
an insulating spacer extending on sidewalls and bottom surfaces of the word line cut opening and the hole and defining a space therein; and
an insulating buried layer in the space.

16. The integrated circuit device of claim 12, wherein the gate stack includes a first gate stack in a lower portion of the gate stack and a second gate stack in an upper portion of the gate stack,
the integrated circuit device further comprising a lower base layer and an upper base layer sequentially stacked on the substrate and between the substrate and the first gate stack,
wherein the channel structure extends through the upper base layer and the lower base layer and contacts the substrate, and
the channel layer contacts the lower base layer.

17. The integrated circuit device of claim 16, wherein the word line cut opening extends through the upper base layer and the lower base layer, and the word line cut opening comprises a lower expansion portion protruding laterally into the lower base layer.

18. The integrated circuit device of claim 17, wherein the word line cut opening comprises an upper expansion portion protruding laterally into the upper base layer, thereby providing a step shape in the upper base layer, and
   a widest width of the lower expansion portion in a second direction is greater than a widest width of the upper expansion portion in the second direction, and the second direction is parallel to the main surface of the substrate and is perpendicular to the first direction.

19. An electronic system comprising:
   a first substrate;
   an integrated circuit device on the first substrate; and
   a controller electrically connected to the integrated circuit device on the first substrate,
   wherein the integrated circuit device includes:
      a second substrate;
      a peripheral circuit on the second substrate;
      an input/output pad electrically connected to the peripheral circuit;
      a gate stack extending on the peripheral circuit in a first direction that is parallel to a main surface of the second substrate, the gate stack including a plurality of gate electrodes overlapping each other in a vertical direction that is perpendicular to the main surface;
      a channel structure extending through the gate stack and extending in the vertical direction;
      a word line cut opening extending through the gate stack in the vertical direction and extending in the first direction; and
      an upper support layer on the gate stack and comprising a hole overlapping the word line cut opening in the vertical direction,
      wherein an upper surface of the channel structure is in contact with a lower surface of the upper support layer,
      wherein a narrowest width of the hole in a second direction is greater than a widest width of the word line cut opening in the second direction,
      wherein the narrowest width of the hole is greater than a distance in the second direction from a first portion of an uppermost one of the plurality of gate electrodes to a second portion of the uppermost one of the plurality of gate electrodes that is separated from the first portion by the word line cut opening, and
      wherein the second direction is parallel to the main surface of the second substrate and is perpendicular to the first direction.

20. The electronic system of claim 19, wherein the first substrate further includes wiring patterns electrically connecting the integrated circuit device to the controller,
   wherein the hole comprises a portion that is in the gate stack, and
   wherein the hole includes a plurality of holes arranged in the first direction along the word line cut opening.

* * * * *